United States Patent
Kunita

(10) Patent No.: US 7,338,749 B2
(45) Date of Patent: Mar. 4, 2008

(54) PROCESS FOR MAKING FLEXOGRAPHIC PRINTING PLATE

(75) Inventor: Kazuto Kunita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/873,175

(22) Filed: Jun. 23, 2004

(65) Prior Publication Data

US 2004/0259033 A1    Dec. 23, 2004

(30) Foreign Application Priority Data

Jun. 23, 2003  (JP) ............................ 2003-178044

(51) Int. Cl.
*G03F 7/30* (2006.01)
(52) U.S. Cl. ...................... 430/306; 430/300
(58) Field of Classification Search ................ 430/300, 430/306; 101/463.1, 465, 466, 467
See application file for complete search history.

(56) References Cited

U.S. PATENT DOCUMENTS

| 5,495,803 | A | * | 3/1996 | Gerber et al. ............. 101/401.1 |
| 5,779,779 | A | | 7/1998 | Jolly |
| 6,158,844 | A | * | 12/2000 | Murakami et al. ............. 347/55 |
| 6,358,668 | B1 | * | 3/2002 | Leenders et al. ......... 430/271.1 |
| 6,861,203 | B2 | * | 3/2005 | Gelbart ....................... 430/306 |
| 2003/0112312 | A1 | | 6/2003 | Gelbart |
| 2004/0187719 | A1 | | 9/2004 | Knoll et al. |

FOREIGN PATENT DOCUMENTS

| DE | 417127 4 C | 8/1925 |
| DE | 102 58 421 A1 | 6/2003 |
| EP | 0 465 949 A | 1/1992 |
| EP | 1 239 329 A | 9/2002 |
| JP | 63-109052 A | 5/1988 |
| JP | 06-166162 A | 6/1994 |
| JP | 2002 099096 A | 4/2002 |
| WO | 97/25206 A | 7/1997 |
| WO | 03/014831 A | 2/2003 |

* cited by examiner

*Primary Examiner*—John S. Chu
(74) *Attorney, Agent, or Firm*—Sughrue Mion, PLLC

(57) ABSTRACT

A process for making a flexographic printing plate is provided, the process including a step of forming an image mask on a flexographic printing starting plate by discharging an oil-based ink by an ink-jet method, the flexographic printing starting plate having a support and a photosensitive resin layer provided thereon; a step of subjecting the photosensitive resin layer to overall exposure via the image mask; and a step of developing the photosensitive resin layer thus exposed.

11 Claims, 2 Drawing Sheets

PROCESS FOR MAKING FLEXOGRAPHIC PRINTING PLATE

BACKGROUND OF THE INVENTION

1. Field of the Invention

The present invention relates to a process for making a flexographic printing plate.

2. Description of the Related Art

In recent years, as a result of the rapid progress in image processing by computer and various types of high output laser, CTP (computer to plate) processing of printing plates has been advancing rapidly. In flexographic printing plates, a flexographic CTP system has been proposed in which a mask is formed imagewise using a high output IR laser, and this is followed by overall UV exposure and development, thus giving a flexographic printing plate.

However, after the mask-making step, the current flexographic CTP employs the same steps as those of the conventional flexographic plate system from the overall UV exposure onward, and improvement of the productivity, which is the main purpose of CTP, is not satisfactory.

On the other hand, commercially available flexographic CTP plates are complicated sensitive materials with a multilayer structure in which a photosensitive resin is provided on a flexible support such as a polyethylene terephthalate (PET) (this is called a 'conventional flexographic plate'), and an IR-sensitive layer that is made sensitive to an IR laser so as to form a mask is further provided on the photosensitive resin, and they are expensive compared with conventional flexographic plates. This proposed system also has the problems that an expensive, short-life, high output laser is used, and the IR-sensitive layer, which is removed when forming the mask, must be disposed of as waste.

JP-A-63-109052 (JP-A denotes a Japanese unexamined patent application publication) discloses a process in which an aqueous ink image is applied to a printing plate having a photosensitive resin layer, then exposed, and developed with an aqueous developing agent to give a relief image. German Patent Laid-open No. 417127 discloses a plate material having a transparent top coat layer on a photosensitive recording layer, an image mask being formed on the top coat layer by an ink-jet printer, thus making a plate. JP-A-6-166162 discloses a process for making a seamless flexographic plate by forming an ink-jet mask on a cylindrical plate material, and carrying out exposure and development.

BRIEF SUMMARY OF THE INVENTION

It is an object of the present invention to provide a system and a plate-making process that can convert a so-called 'analog flexographic printing plate' or 'conventional flexographic plate', which gives a flexographic printing plate by using a litho film as an image mask on a photosensitive resin layer provided on a flexible support such as PET and carrying out overall exposure with UV light, into a 'digital flexographic printing plate' (flexographic CTP), into which image information can be input directly from a computer and which uses no litho film.

This object has been accomplished by the following means.

A process for making a flexographic printing plate, the process comprising a step of forming an image mask on a flexographic printing starting plate by discharging an oil-based ink by an ink-jet method, the flexographic printing starting plate having a support and a photosensitive resin layer provided thereon, a step of subjecting the photosensitive resin layer to overall exposure via the image mask, and a step of developing the photosensitive resin layer thus exposed.

The support is preferably flexible, and the photosensitive resin layer has physical properties and photosensitivity that are suitable for making a flexographic printing plate. The mask image has the properties of absorbing or reflecting light having a wavelength that is effective for image formation. As a result of the overall exposure subsequent to formation of the photosensitive mask, the photosensitive resin in either the exposed area or the non-exposed area alone is selectively cured or becomes dissoluble, and is selectively removed by a subsequent development treatment, thus giving a flexographic printing plate.

The present invention also provides a system for forming a flexographic printing plate. This system comprises a flexographic printing starting plate and an electrostatic ink-jet device for forming an image mask on a photosensitive resin layer of the flexographic printing starting plate. The electrostatic ink-jet device comprises an ink tank, a discharge head, and a driver for driving the head, and the system preferably comprises a compartment for flexographic printing starting plates, conveying means therefor, fixing means therefor, and a compartment for masked flexographic printing starting plates.

DETAILED DESCRIPTION OF THE INVENTION

The step of forming an image mask in the present invention is explained below with reference to the drawings.

The terms used in the explanation below have the following meanings.

'Flexographic printing starting plate': this is provided for formation of an image mask and has, on a support, preferably a flexible support, a photosensitive resin layer for forming a flexographic printing plate. Various types of conventional flexographic plates can be used as the flexographic printing starting plate. After an image mask is formed on the photosensitive resin layer of the flexographic printing starting plate by the process of the present invention, it is subjected to overall exposure and a development treatment to give a flexographic printing plate.

'Masked flexographic printing starting plate': a flexographic printing starting plate in which an image mask has already been formed on the flexographic printing starting plate by the process of the present invention. A target flexographic printing plate can be obtained by subjecting it to a development treatment after overall exposure.

Figure 1:
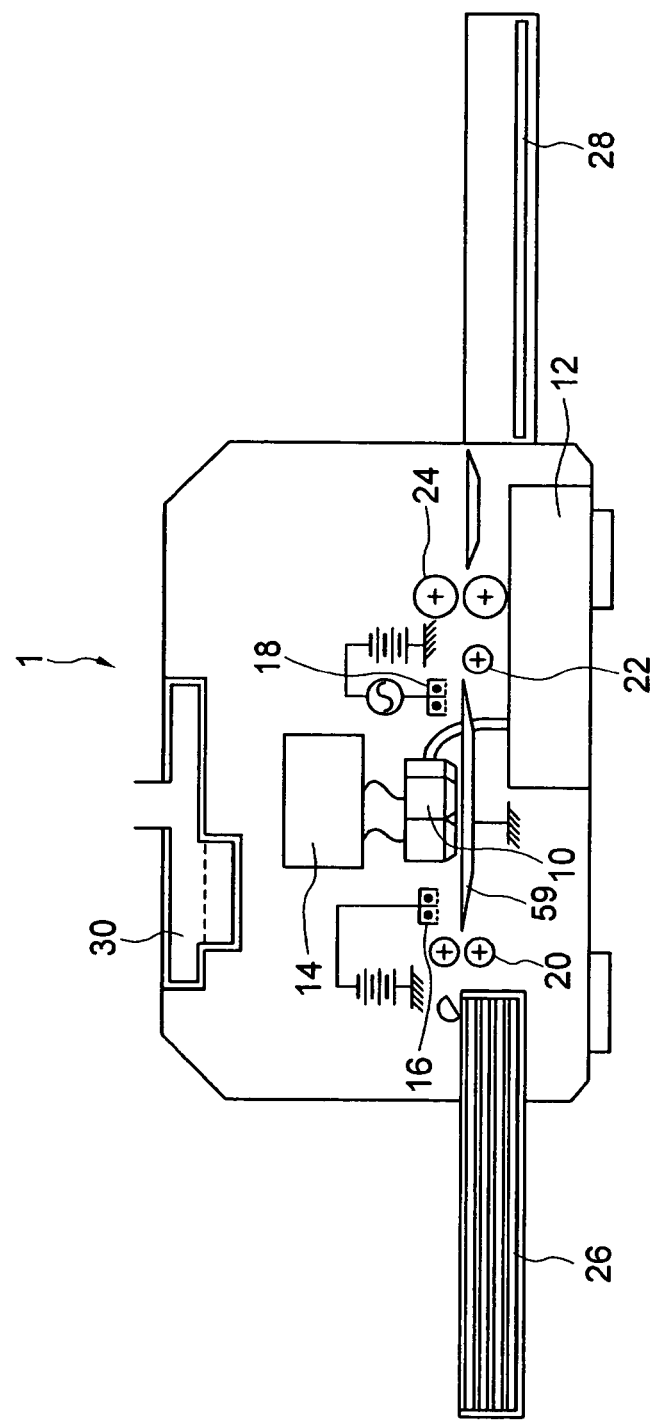
FIG. 1 is a sectional view showing schematically one example of an electrostatic ink-jet device used in the present invention.

FIG. 1 is a sectional view showing schematically one example of an electrostatic ink-jet device used in the plate-making process of the present invention.

In this device, an oil-based ink that absorbs or reflects light to which it is exposed (light at 200 to 500 nm) is discharged directly on the photosensitive resin layer provided on the support of the flexographic printing starting plate by an ink-jet method, thus forming an image mask.

In the present invention, the ink-jet method is preferably an electrostatic ink-jet method. In the explanation below, a case in which an electrostatic ink-jet device is used is illustrated as an example.

An electrostatic ink-jet device 1 shown in FIG. 1 comprises a discharge head 10, an ink tank 12 for supplying ink to the discharge head 10, and a head driver 14 for driving the discharge head 10 according to an image signal from external equipment such as a computer, which is not illustrated. The electrostatic ink-jet device 1 also comprises a charger 16 for charging the surface of a flexographic printing starting plate, and a charge eliminator 18 for eliminating the charge of the masked flexographic printing starting plate after formation of the mask image is completed. Disposed upstream and downstream respectively of the discharge head 10 are feed rollers 20 for feeding the flexographic printing starting plate from a flexographic printing starting plate compartment 26 to a back electrode 59, and a conveyor roller 22 and image fixation rollers 24 for fixing ink onto the masked flexographic printing starting plate after mask image formation and conveying it to a masked flexographic printing starting plate compartment 28. The image fixation rollers 24 fix ink on the flexographic printing starting plate by evaporating the solvent in the ink forming the mask image. Also disposed within the electrostatic ink-jet device 1 is solvent recovery means 30 for recovering solvent vapor evaporating from an oil-based ink, the solvent vapor within the device being recovered by the recovery means, and air from which the solvent has been removed being discharged outside the device.

Figure 2:
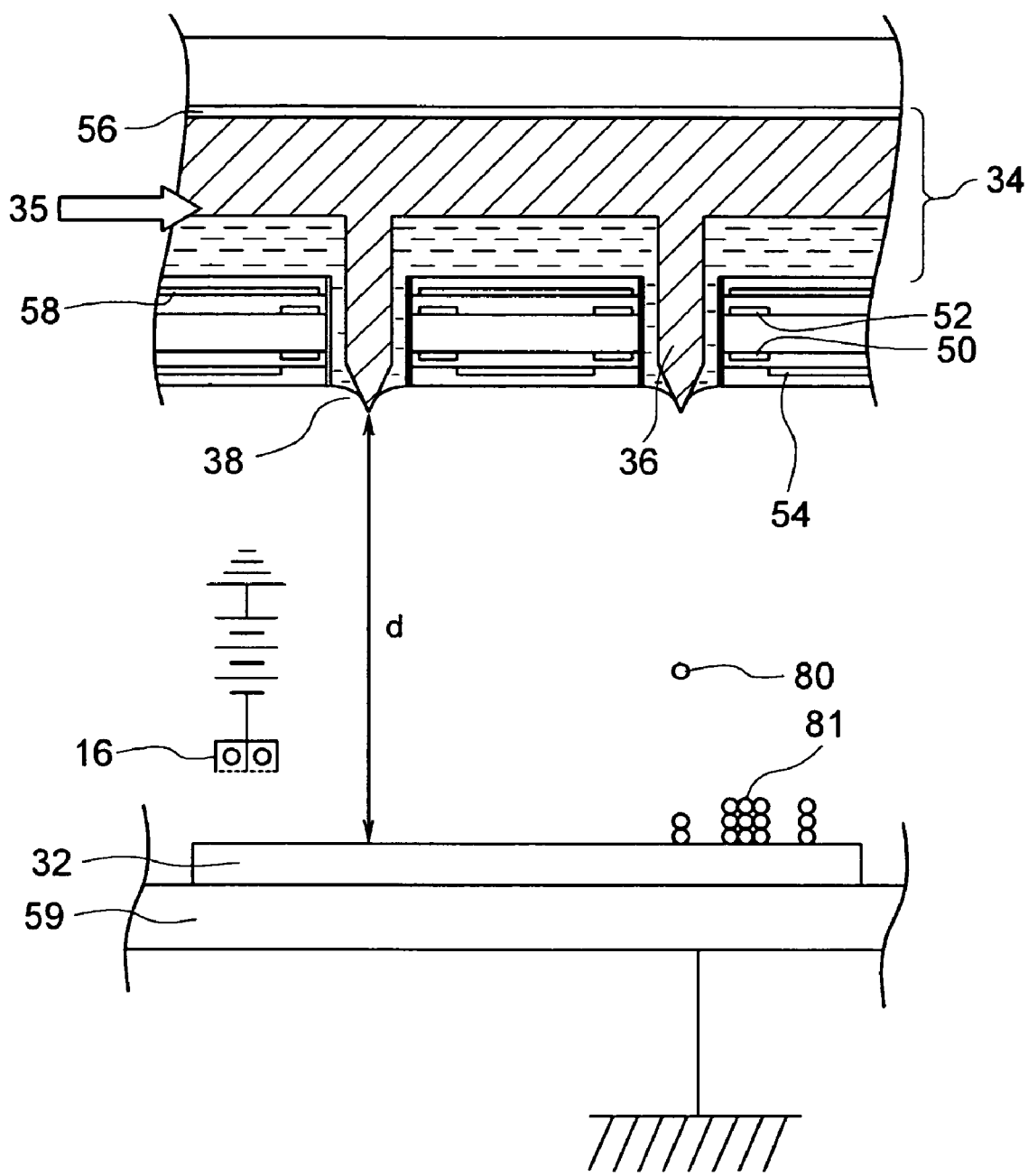
FIG. 2 is a sectional view showing the detailed structure of the surroundings of a discharge head in FIG. 1.

FIG. 2 is a sectional view showing schematically the detailed structure of surroundings of the discharge head 10 in FIG. 1.

The discharge head 10 has an ink chamber 34 through which ink flows in a fixed direction, and a discharge section 36 for discharging the ink toward a flexographic printing starting plate 32. The discharge section 36 is equipped with an insulative ink guide 38 for guiding an ink droplet 80 in flight from the ink chamber 34 toward the flexographic printing starting plate 32. It is preferable for a gap d between the insulative ink guide 38 and the flexographic printing starting plate 32, which is electrostatically attached onto the back electrode 59, to be on the order of 200 to 1,000 µm. Provided around the perimeter of the discharge section 36 are a first discharge electrode 50 and a second discharge electrode 52, a voltage being applied thereto according to an image signal.

A guard electrode 54 is provided in order to prevent the voltage applied to the first discharge electrode 50 and the second discharge electrode 52 from having an effect on the electric field of an adjacent discharge section 36.

An electrophoresis electrode 56 is disposed in an upper part of the ink chamber, and by applying a predetermined voltage thereto it is possible to control the electrophoresis of charged particles in the ink toward the discharge position of the insulative ink guide 38, thereby improving the discharge response.

A shield electrode 58 is placed above the second discharge electrode 52. By applying a voltage to the shield electrode 58 it is possible to localize the charged particles of the ink in a lower part of the ink chamber 34, thereby increasing the concentration of the charged particles in the in-flight ink droplet 80.

In FIG. 1, the feed rollers 20 can employ known rollers, and are arranged so that an unprocessed flexographic printing starting plate can be conveyed from the compartment to a mask image formation position. The unprocessed flexographic printing starting plate can have a coversheet on the surface thereof; mask formation by the discharge head can be carried out with the coversheet attached to the unprocessed flexographic printing starting plate, or coversheet peeling off means can be provided within the electrostatic ink-jet device and mask formation by the discharge head can be carried out after peeling off the coversheet. Furthermore, since there might be dust, etc. attached to the flexographic printing starting plate, it is preferable to remove it. As removing means, known non-contact methods such as those involving suction removal, blow off removal by air, and electrostatic removal as well as contact methods such as those employing a brush, a roller, etc. can be employed, and in the present invention air suction, or blow off by air, or a combination of the two is desirably employed. It is also possible to form the feed roller from a slightly adhesive roller equipped with a roller cleaner, and carry out removal of dust, etc. while supplying the flexographic printing starting plate.

In FIG. 1, the flexographic printing starting plate conveyed by the feed rollers 20 is fed to the back electrode 59. Instead of conveying the flexographic printing starting plate by the rollers alone as shown in FIG. 1, it is also possible to use a conveyor belt. As the conveyor belt, a conveyor belt formed by coating a metal belt with a fluorine resin can be used.

As the charger 16, in addition to a Scorotron, various types of method such as a Corotron, a solid-state charger, or a discharge needle can be used, and a conductive roller can also be used suitably. The charger 16 uniformly charges the surface of flexographic printing starting plate.

By applying a recording signal voltage to the discharge electrode using the charged potential of the charged flexographic printing starting plate as the bias, the ink droplet 80 is made to fly so that it strikes the flexographic printing starting plate 32, thus forming a mask image.

Providing heating means for the flexographic printing starting plate so as to increase the temperature of the flexographic printing starting plate is also effective for improving the image quality, and since quick fixation of the discharged ink droplets 81 that have struck the flexographic printing starting plate 32 is promoted, their spreading is further suppressed.

The flexographic printing starting plate with a mask image formed thereon (hereinafter also called the 'masked flexographic printing starting plate') is subjected to charge elimination by the charge eliminator 18, peeled off from the back electrode 59, and conveyed to the image fixation rollers 24 by the conveyor roller 22.

FIG. 1 illustrates as an example a corona charge eliminator as the charge eliminator 18, but various types of methods involving a Scorotron, a solid-state charger, a discharge needle, etc. can be employed, and a conductive roller can also be used suitably.

The masked flexographic printing starting plate thus peeled off is transferred to the image fixation rollers 24 by the conveyor roller 22, and subjected to fixation. With regard to fixing means, known means involving heat fixation, solvent fixation, flash exposure fixation, etc. can be used singly or in combination.

The heat fixation generally employs irradiation with infrared rays, a halogen lamp, or a xenon flash lamp, hot air fixation utilizing a heater, or heat roll fixation. The solvent fixation comprises exposing to a mist or vapor of a solvent that is compatible with the resin component in the ink, and recovering the surplus solvent vapor. Flash fixation employing a xenon lamp, etc. has the advantages that fixation can be done in a short period of time. It is preferable to prevent the image on the masked flexographic printing starting plate from contacting anything, at least from the oil-based ink image formation by the discharge head 10 until fixation by the image fixation rollers 24.

The speed of movement of the masked flexographic printing starting plate during fixation can be determined freely. The fixed masked flexographic printing starting plate is stored in the masked flexographic printing starting plate compartment 28.

The electrostatic ink-jet device 1 used in the present invention has the recovery means 30 for recovering the solvent generated from the oil-based ink. The recovery means is formed from a solvent vapor absorbing material, for which various types of active carbon can suitably be used; a gas containing the solvent vapor within the device is introduced into the absorbing material by means of an exhaust fan, and discharged outside the device after the vapor is adsorbed and recovered.

The present invention is not limited to the above-mentioned example, and the number, the shape, the relative configuration, the charging polarity, etc. of constituent devices such as the rollers and the charger can be determined freely.

One example of the operation of the electrostatic ink-jet device in the present invention is now explained. A case in which an ink containing positively charged pigment particles is used is explained as an example.

In FIG. 2, when forming a mask image, a voltage of +300 V is applied to the electrophoresis electrode 56, and a voltage of +100 V is applied to the shield electrode 58, thus localizing the charged particles in the ink at a lower part of the ink chamber 34. Here, the ink is supplied to an ink flight position at the extremity of the insulative ink guide 38 in a state in which the concentration of the charged particles in the ink is high. The signal voltage that is applied to the first discharge electrode 50 and the second discharge electrode 52 according to the image signal is for example a pulse voltage that is +600 V when it is ON. Meanwhile, the flexographic plate 32 is charged to a voltage of −1.5 kV by a Scorotron charger. When the discharge voltage is ON (a state in which 600 V is being applied), the ink droplet 80 is discharged from the ink flight position at the extremity of the insulative ink guide 38, and flies toward the flexographic printing starting plate 32. A mask image is formed by the ink droplets 81 that have struck the flexographic printing starting plate 32. In order to precisely control the flight of the ink liquid droplet so as to improve the precision with which it strikes the flexographic printing starting plate 32, it is preferable to apply a voltage of +100 V to the guard electrode 54 for suppressing electric field interference.

In the electrostatic ink-jet method, since the ink droplet 80 discharged from the head is exposed while in flight to an electric field that directs it toward the flexographic printing starting plate, and the precision with which the ink droplet 80 strikes the flexographic printing starting plate is good, a high density image mask can be formed with good precision even by superimposing the discharged oil-based ink a plurality of times. Since an optical density of on the order of 1.3 to 2.2 is usually obtained by printing a dot image once, when the oil-based ink is discharged two or three times repeatedly, an optical density of 3.0 or more can be obtained, which is preferable for a dot produced by a plurality of printings.

As an ink used in the electrostatic ink-jet method, an oil-based ink is preferable. The ink preferably contains a material that, among the components of the light to which the material is exposed, absorbs or reflects light in a wavelength region in which the photosensitive resin layer is sensitive. As such a material, colored particles are preferably used, and examples of the colored particles include pigments and dyes. The light sensitive wavelength region is preferably 200 to 500 nm.

Examples of the pigment absorbing light at 200 to 500 nm include black pigments such as carbon black, and examples of the pigment reflecting light at this wavelength include white pigments such as titanium oxide and zinc oxide.

As a pigment used in the present invention, a black pigment is preferable and, in particular, high resistivity carbon black, which has high resistance, is more preferably used. By using the high resistivity carbon black the effect of suppressing the attachment of particles to an electrode of the discharge head is exhibited. This is explained in detail below.

The oil-based ink used as an ink is preferably one in which charged particles having a particle size of on the order of 0.1 to 5.0 μm are dispersed in a liquid carrier. The liquid carrier is required to be an insulative organic solvent having high electrical resistivity ($1 \times 10^{10}$ Ω·cm or more). If a liquid carrier having low electrical resistivity is used, since the liquid carrier itself is charged by charge injection due to the voltage applied by the discharge electrode, the concentration of charged particles (charged ink particles) cannot be increased, and the charged particles cannot be concentrated. Moreover, since there is a possibility that a liquid carrier having extremely low electrical resistivity might cause electrical conduction between adjacent recording electrodes, it is not suitable for use in the present invention.

The relative permittivity of the insulative organic solvent is preferably 5 or less, more preferably 4 or less, and yet more preferably 3.5 or less. Use of an organic solvent having a relative permittivity in this range enables the electric field to be applied effectively to the charged particles in the insulative organic solvent, thereby making the charged particles migrate easily.

With regard to the insulative organic solvent used in the present invention, a straight chain or branched aliphatic hydrocarbon, an alicyclic hydrocarbon, an aromatic hydrocarbon, and halogen-substituted derivatives of these hydrocarbons are preferably used. Examples thereof include hexane, heptane, octane, isooctane, decane, isodecane, decalin, nonane, dodecane, isododecane, cyclohexane, cyclooctane, cyclodecane, benzene, toluene, xylene, mesitylene, ISOPAR C, ISOPAR E, ISOPAR G, ISOPAR H, and ISOPAR L (ISOPAR: a trade name of Exxon Corp.), Shellsol 70 and Shellsol 71 (Shellsol: a trade name of Shell Chemicals Ltd.), Amsco OMS and Amsco 460 solvents (Amsco: a trade name of American Mineral Spirits Company), and silicone oil (e.g., KF-96L manufactured by Shin-Etsu Chemical Co., Ltd.), and they can used singly or in combination.

The image mask should be either opaque or reflective with respect to the ultraviolet or visible component of the light that is used for exposure of the photosensitive resin layer. The image mask should therefore contain a material that is opaque to radiation. Any material that prevents actinic radiation from penetrating the photosensitive resin layer can be used for formation of the image mask as the radiation-opaque material. Examples of suitable radiation-opaque materials include colorants that absorb ultraviolet light or visible light, dark colored inorganic pigments, and combinations thereof. Preferred radiation-opaque materials are carbon black and graphite. The concentration of carbon black as the radiation-opaque material is determined so that a required optical density is obtained, that is, so that the image mask can prevent radiation from penetrating the photosensitive resin layer. In general, it is preferable for the transmission optical density (OD) to be greater than 2.0, more preferably 3.0 or more, and particularly preferably 4.0 or more.

Examples of pigments suitable as the opaque material used for the formation of an image mask include dark colored inorganic pigments such as carbon black, graphite, copper chromite, chromium oxide, and chromium-cobalt aluminate. Examples of suitable colorants include poly (substituted) phthalocyanine compounds; cyanine dyes; squarylium dyes; chalcogenopyryloarylidene dyes; bis(chalcogenopyrrylo)-polymethine dyes; oxyindolizine dyes; bis (aminoaryl)-polymethine dyes; merocyanine dyes; croconium dyes; metal thiolate dyes; and quinoid dyes.

The dark colored inorganic pigment generally functions as the radiation-opaque material. Carbon black, graphite, and mixtures thereof are particularly preferred dark colored inorganic pigments. Metals and alloys also function as the radiation-opaque material. Examples of the metal include aluminum, copper, and zinc, and examples of the alloy include an alloy of bismuth, indium, and copper.

The particles that are to be dispersed in the insulative organic solvent may be dispersed in a dielectric liquid using the pigment itself as dispersed particles, or may be introduced into dispersed resin particles in order to improve fixation. When the particles are introduced, a method in which the pigment is coated with a resin material for the dispersed resin particles to give resin-coated particles is generally employed and, with regard to a dye, etc., a method in which the dye is used for coloring the dispersed resin particles to give colored particles is generally employed. These particles are preferably contained in the range of 0.5 to 30 wt % of the entire ink, more preferably 1.5 to 25 wt %, and yet more preferably 3 to 20 wt %.

As the pigment used in the present invention, a black pigment is preferable.

Examples of the black pigment include carbon black and graphite, and carbon black is preferably used.

Among carbon blacks, high resistivity carbon black is more preferably used. In this case, it can be dispersed directly in the nonaqueous solvent.

The high resistivity carbon black referred to here means carbon black having a volume resistivity of $1 \times 10^{-2}$ Ω·cm or more, and preferably $1 \times 10^{-1}$ Ω·cm or more.

The volume resistivity of carbon black is measured as follows.

0.10 g of the carbon black that is the subject of measurement is weighed into a cup having a circular brass base with a cross-sectional area of 1.327 cm$^2$ and a cylinder surrounding the side of the base, the surface of the carbon black is leveled, a brass lid having a cross-sectional area of 1.327 cm$^2$ is placed thereon, and a pressure of 300 kg/cm$^2$ is applied for 100 sec. Subsequently, only the cylinder around the cup is removed, the current when a dc voltage of 3 V is applied between the upper and lower brass plates is measured, and the volume resistivity is obtained from the current and the thickness of the carbon black pellet.

By using a high resistivity carbon black, the effect of suppressing attachment of particles to an electrode of the discharge head is exhibited.

The average particle size of the pigment particles dispersed in the insulative solvent of the present invention is preferably 0.1 to 5 μm. It is more preferably in the range of 0.2 to 1.5 μm, and yet more preferably 0.4 to 1.0 μm. This particle size is determined using a CAPA-500 (trade name; manufactured by Horiba Ltd.).

The viscosity of the ink composition is preferably in the range of 0.5 to 5 mPa·sec, more preferably 0.6 to 3.0 mPa·sec, and yet more preferably 0.7 to 2.0 mPa·sec. The pigment particles are charged; various types of charge control agents used in electrophotographic liquid developers can be used as necessary, and the amount of charge is preferably in the range of 5 to 200 μC/g, more preferably 10 to 150 μC/g, and yet more preferably 15 to 100 μC/g. Addition of a charge control agent might change the electrical resistance of the dielectric solvent, and the partition coefficient P defined below is 50% or more, preferably 60% or more, and more preferably 70% or more.

$$P = 100 \times (\sigma_1 - \sigma_2)/\sigma_1$$

Here, $\sigma_1$ denotes the electrical conductivity of the ink composition, and $\sigma_2$ denotes the electrical conductivity of a supernatant obtained by subjecting the ink composition to centrifugation. The electrical conductivity is a value measured using an LCR meter (AG4311 manufactured by Ando Electric Co., Ltd.) and electrodes for a liquid (Model LP-05 manufactured by Kawaguchi Electric Works Co., Ltd.) at an applied voltage of 5 V and a frequency of 1 kHz. Centrifugation was carried out using a small scale high speed cooled centrifuge (SRX-201 manufactured by Tomy Seiko Co., Ltd.) at a rotational speed of 14,500 rpm and a temperature of 23° C. for 30 minutes.

In accordance with the ink composition having the above-mentioned constitution, the charged particles can easily migrate and be concentrated.

The electrical conductivity $\sigma_1$ of the ink composition is preferably in the range of 100 to 3,000 pS/cm, more preferably 150 to 2,500 pS/cm, and yet more preferably 200 to 2,000 pS/cm. By controlling the electrical conductivity so that it is in the above-mentioned range, the voltage applied to the discharge electrode is prevented from becoming extremely high, and there is no possibility of electrical conduction being caused between adjacent recording electrodes. The surface tension of the ink composition is preferably in the range of 15 to 50 mN/m, more preferably 15.5 to 45 mN/m, and yet more preferably 16 to 40 mN/m. By making the surface tension in this range, the voltage applied to the discharge electrode is prevented from becoming extremely high, and there is no possibility of the ink leaking out and contaminating the area around the head.

The flexographic printing starting plate includes as essential constituents a support and a photosensitive resin layer provided thereon.

The support can be any flexible material that is suitable for the preparation of a flexographic printing starting plate. Examples of suitable support materials include polymer films formed from addition-polymerized polymers and linear condensed polymers; transparent foams and woven fabrics; and metals such as steel, stainless steel, copper, or aluminum. The support is preferably transparent to radiation (radiation means ultraviolet light and/or visible light throughout the present specification), and is also transparent to infrared light in some cases; that is, the light can pass through the support without being attenuated or substantially attenuated. Although a metal support is not transparent to radiation, this is allowed for certain types of final application. A preferred support is a polyester film, and polyethylene terephthalate (PET) is particularly preferable. The thickness of the support is typically 0.0051 to 0.025 cm, and preferably 0.0076 to 0.020 cm.

The term 'photosensitive resin layer' used here means photopolymerizable, photocrosslinking, and both thereof. This photosensitive resin layer contains an elastomeric binder, at least one monomer, and a photopolymerization initiator as essential components. The photopolymerization initiator is sensitive to radiation other than infrared light. In many cases, the photopolymerization initiator is sensitive to visible light and/or ultraviolet light. Any photosensitive resin composition that is suitable for the formation of a flexographic printing plate can be used in the present invention. Examples of suitable compositions are described in, for example, Chen, et al., U.S. Pat. No. 4,323,637; Grueetzmacher, et al., U.S. Pat. No. 4,427,749, and Feinberg, et al., U.S. Pat. No. 4,894,315.

The elastomeric binder can be a single polymer or a polymer mixture, and this can be soluble, swellable, or dispersible in a liquid developer employing an aqueous, semi-aqueous, or organic solvent.

Examples of binders that are soluble or dispersible in an aqueous or semi-aqueous liquid developer are described in Alles, U.S. Pat. No. 3,458,311; Pohl, U.S. Pat. No. 4,442,302; Pine, U.S. Pat. No. 4,361,640; Inoue, et al., U.S. Pat. No. 3,794,494; Proskow, U.S. Pat. Nos. 4,177,074 and 4,431,723; and Worns, U.S. Pat. No. 4,517,279.

Examples of binders that are soluble, swellable, or dispersible in an organic solvent liquid developer include natural or synthetic polymers of conjugated diolefin hydrocarbons such as polyisoprene, 1,2-polybutadiene, 1,4-polybutadiene, butadiene/acrylonitrile, butadiene/styrene thermoplastic-elastomeric block copolymer, and other copolymers. Block polymers described in Chen, U.S. Pat. No. 4,323,636; Heinz, et al., U.S. Pat. No. 4,430,417; and Toda, et al., U.S. Pat. No. 4,045,231, etc. can be used.

The binder preferably comprises at least 65 wt % of the photosensitive resin layer. The term 'binder' used here includes a core-shell microgel and a mixture of a microgel and a preformed macromolecular polymer such as those described in Fryd, et al., U.S. Pat. No. 4,956,252.

The binder preferably used in the present invention is a binder that is soluble or dispersible in an aqueous or semi-aqueous liquid developer, and representative examples of such water-soluble binders are explained in detail below. That is, (1) a microgel binder disclosed in JP-A-7-84362 combining an elastomer and an amphoteric stabilizer that adsorbs on the elastomer and has both hydrophobic and hydrophilic portions, (2) a core-shell microgel binder disclosed in JP-A-7-84369 comprising an elastomer as the core and a hydrophilic component as the shell, and (3) a microgel binder disclosed in JP-A-7-333830 comprising a mixture of an elastomer component and a hydrophilic polyamide that adsorbs on the elastomer component, are explained below.

The microgel binder (1) is explained below.

This microgel binder is prepared from an aqueous dispersion of an elastomeric polymer. This dispersion contains at least one type of polymeric stabilizer, and this has a hydrophobic portion and a hydrophilic portion. The hydrophobic portion is oriented toward the surface of the dispersed elastomeric polymer. The hydrophilic portion is oriented away from the surface of the elastomeric polymer and extends into the aqueous phase. A solid binder can be obtained by removing water from this aqueous dispersion.

The binder in the photosensitive layer imparts the bulk properties to the final flexographic printing plate. It should therefore be elastomeric and result in plates with sufficient resilience, flexibility or limpness, toughness, ink solvent resistance, and with good ink transfer. Such desirable properties are well known in the flexographic art area. Binders suitable for practicing the present invention are microgels of elastomeric polymers, which can be crosslinked, and which have adsorbed on the surface thereof at least one compound having a hydrophobic portion and a hydrophilic portion. Such binders are referred to as 'composite binders.'

Elastomeric polymers that can be used in this microgel binder are those that have the necessary elastic properties, toughness and chemical resistance required by flexographic printing plates and that can be formed or redispersed as an aqueous dispersion. Examples of suitable polymers include poly(butadiene), poly(butadiene-styrene), poly(isoprene), poly(isoprene-styrene), natural rubber, neoprene, and the like. Preferred elastomeric polymers are poly(styrene-butadiene) copolymers that have no more than about 10 wt % styrene. Other materials that can be used include polyurethane elastomers and polymers of ethylene-propylene-diene monomers. Mixtures of elastomeric polymers can be used so long as they are compatible, i.e., they form a photosensitive layer that develops with good resolution. In general, mixtures that form a photosensitive layer that is not cloudy or hazy can be used. The elastomeric polymers may have some degree of crosslinking. However, the crosslinking should not be too extensive or the elastomeric properties of the polymer will be adversely affected.

The elastomeric polymer is first formed as a latex dispersion by emulsion polymerization. Emulsion polymerization generally refers to polymerization in an aqueous system in which monomer is present in a dispersed second phase, resulting in polymer as a dispersed solid phase. The solid elastomeric polymer dispersion in aqueous solution is variously referred to as a rubber latex, elastomer latex, colloidal elastomer, or microgel dispersion. Very small polymer particles are produced, typically submicron. Emulsion polymerization techniques are well know in the art and discussions can be found in, e.g., 'Emulsion Polymerization', I. Piirma and J. L. Gardon, eds., ACS Symposium Series, Vol. 24 (1976); and 'Emulsion Polymers and Emulsion Polymerization', D. R. Bassett and A. E. Hamieliec, eds., ACS Symposium Series, Vol. 165d (1981).

Adsorbed onto the surface of the polymer particles in the latex is a polymeric stabilizer. The polymeric stabilizer is a compound having a hydrophobic portion and a hydrophilic portion. In the latex, the polymeric stabilizer preferentially adsorbs onto the surface of the elastomeric polymer at the solid-liquid interface such that the hydrophobic portion is oriented toward the surface of the dispersed elastomeric polymer, while the hydrophilic portion is oriented away from the polymer surface and extends into the aqueous phase. Examples of types of polymers that can be used as the polymeric stabilizer include diblock copolymers and graft copolymers. In a diblock copolymer one part of the polymer molecule will consist almost exclusively of hydrophobic monomers, while the other part will consist almost exclusively of hydrophilic monomers. In a graft copolymer, a backbone of either hydrophobic or hydrophilic monomers will have grafted thereon side chains of the other type of monomer. Other types of polymers can be used so long as they have a hydrophobic portion and a hydrophilic portion.

Examples of monomers that are suitable in the hydrophobic portion include alkyl esters of acrylic and methacrylic acid, where the alkyl group has 1 to 6 carbon atoms; propylene oxide; and combinations thereof. Examples of monomers that are suitable in the hydrophilic portion include acrylic and methacrylic acid; sodium and potassium salts of acrylic and methacrylic acid; ethylene oxide; vinylpyrrolidone; and combinations thereof. Examples of suitable polymeric stabilizers include diblock copolymers of butyl methacrylate and methacrylic acid, and the ammonium, sodium or potassium salts thereof; diblock copolymers of propylene oxide and ethylene oxide; graft copolymers of methyl methacrylate and ethylene oxide; and graft copolymers of methyl methacrylate and vinylpyrrolidone. A preferred polymeric stabilizer is a diblock copolymer of butyl methacrylate and methacrylic acid.

It has been found that the mechanical properties of the plate as well as the washout rate will depend on an interrelated set of variables including: elastomer particle size in the latex; the relative amounts of elastomeric polymer and polymeric stabilizer; the relative amounts of hydrophobic portion and hydrophilic portion in the polymeric stabilizers; the degree of compatibility between the elastomeric polymer and the hydrophobic portion; the ease of dissolution or dispersion in water for the hydrophilic portion; and others. The elastic properties of the final plate, i.e., durometer, resilience, flexibility, are dependent, in general, on the elastomeric polymer, since the polymeric stabilizer is usually not elastomeric. The washout rate is generally dependent on the polymeric stabilizer as it supplies the hydrophilic portion that dissolves or disperses in aqueous solution. Thus, for a given latex particle size, the elastomeric properties improve (lower durometer, higher resilience, greater flexibility) as the ratio of elastomeric polymer to polymeric stabilizer increases, while the washout rate decreases. However, the elastic properties of the final flexographic printing plate are also improved by increasing the particle size in the latex. In general, it is possible to use a larger latex particle size and increase the ratio of elastomeric polymer to polymeric stabilizer and achieve both good elastomeric properties and washout rates.

Within the polymeric stabilizer there must be a sufficient amount of the hydrophobic portion in order for the polymeric stabilizer to remain adsorbed on the surface of the elastomeric polymer particles. At the same time, there must be a sufficient amount of the hydrophilic portion in order to obtain aqueous processibility. In general, the molar ratio of hydrophobic monomers to hydrophilic monomers within the polymeric stabilizer is in the range of about 4:1 to 1:4. A preferred range is 3:2 to 2:3. The compatibility of the elastomeric polymer with the hydrophobic portion and the ease of dissolution or dispersion of the hydrophilic portion will depend on the chemical nature of the materials used. They should be chosen so as to obtain a photosensitive resin layer and resulting flexographic printing plate with the desired properties.

The composite binder of the invention is generally prepared by first forming the elastomeric polymer latex, adding the polymeric stabilizer, and removing the water.

In general, the procedure to form the elastomeric polymer latex involves the formation of an oil/water emulsion that contains a polymerization catalyst and usually an emulsifier to stabilize the emulsion. The term 'oil' as used herein, refers to a liquid that is substantially immiscible in water and forms a second phase. Such liquids are well known in the art of emulsion polymerization, e.g., ISOPAR. The catalyst can be present in either the oil or water phase. If the elastomer is a copolymer, one of the monomers can be present, usually in the oil phase of the emulsion. A small amount of crosslinking agent, such as allyl methacrylate or diallyl maleate, can also be present. However, the amount of crosslinking in the elastomeric polymer should be fairly low, i.e., less than about 10% crosslinked. Other materials that can be present in the emulsion are discussed in the references above.

After the emulsion is stabilized, the monomer for the elastomeric polymer is added to the emulsion and polymerization is initiated. Usually this is accomplished by the application of heat, typically 50° to 70° C. When polymerization is complete, the polymeric stabilizer is added to the latex, and is usually added as an aqueous solution. In some cases, the polymeric stabilizer is neutralized with aqueous base in order to obtain sufficient water solubility. The two components are then mixed for a time sufficient to allow the adsorption process to occur. Any conventional mixing technique can be used. The time of mixing can vary considerably, but generally 24 hours is sufficient.

It is also possible to add the polymeric stabilizer prior to or during the polymerization process. The polymeric stabilizer can act as an emulsifier for the polymerizing particles. The elastomeric latex in which the polymeric stabilizer is adsorbed onto the surface of the elastomeric polymer particles can be used as a latex and mixed directly with a monomer and a photoinitiator to form the photosensitive resin layer by using a device such as a dewatering extruder, as described in Kafka, et al., U.S. Pat. No. 4,970,037. However, the liquid (i.e., water and oil) can be removed from the latex and converted to a solid prior to mixing with the monomer and the photoinitiator using dewatering extrusion or other well known techniques such as coagulation, filtration, and washing and drying. Freeze drying and spray drying are useful methods for practicing the present invention. Thus, the liquid phases can be removed prior to, simultaneously with, or after mixing with the monomer and photoinitiator.

In addition to the composite binder, there can also be one or more additional macromolecular polymeric binders. These can be added to improve the mechanical properties of the final flexographic printing plate, e.g., toughness, but should not deleteriously affect the desired elastic properties. The additional macro-molecular polymeric binder may contain sufficient acidic or other groups so that binder is also processible in an aqueous developer. Useful aqueous-processible binders have been disclosed in, e.g., U.S. Pat. Nos. 3,458,311; 4,273,857; and 4,293,635. Examples include acid-containing polymers or their salts; and amphoteric polymers such as interpolymers derived from N-alkylacrylamides or methacrylamides, acidic film-forming comonomers, and an alkyl or hydroxyalkyl acrylate. In general, the composite binder or a mixture of the composite binder and the macromolecular polymeric binder will be present in an amount of about 40 to 95 wt %, relative to the total weight of the photosensitive resin layer, and preferably 70 to 90 wt %.

The core-shell microgel binder (2) is now explained.

Core-shell microgel binders that can be used in the present invention are core-shell microgels having a thermoplastic elastomeric core, which can be crosslinked, and a thermoplastic non-crosslinked shell. The core provides the elastic properties of the binder while the shell confers aqueous developability. The core comprises a homopolymer or copolymer of an elastomeric monomer and the shell comprises a copolymer of the elastomeric monomer and an ethylenically unsaturated monomer or oligomer having acidic functionality.

As used herein, the term 'elastomeric monomer' means an ethylenically unsaturated monomer that forms a homopolymer having a glass transition temperature of 10° C. or less. Suitable elastomeric monomers include butadiene, isoprene, neoprene, urethanes, and mixtures thereof. A preferred elastomeric monomer is butadiene.

The monomers that can be copolymerized with the elastomeric monomer to form the core ('core comonomers') are those that form copolymers with elastic properties similar to homopolymers of the elastomeric monomer. In general, core comonomers are added to improve the toughness or durability of the core or to aid in the emulsion polymerization process. In most cases, the core comonomer will not have additional functional groups, i.e., acidic functionality. Examples of suitable core comonomers include polymerizing alkenyl aromatic hydrocarbons, especially vinyl monocyclic aromatic hydrocarbons such as styrene and alpha-methyl styrene. The amount of core comonomer present in the core copolymer should be less than 20 wt % relative to the weight of the copolymer, and preferably less than 10 wt %.

Suitable monomers for copolymerizing with the elastomeric monomer to form the microgel shell are those having (1) at least one ethylenically unsaturated group capable of copolymerizing with the elastomeric monomer and (2) at least one acidic functional group. The acidic group is preferably a carboxylic acid, but sulfonic acid and other acidic groups can be used. Examples of suitable monomers ('acidic monomers') include acrylic and methacrylic acids, crotonic and isocrotonic acids, sorbic acid, maleic acid, cinnamic acid, fumaric acid, itaconic acid and the like. Mixtures of acidic monomers can also be used. Acrylic and methacrylic acids are preferred.

When the core is a copolymer there may be some core comonomer remaining when the acidic monomer is added to form the shell. Thus, the shell can contain some amount of a terpolymer of elastomeric monomer/core comonomer/acidic monomer. However, the amount of such a terpolymer will be very small, if any, since the amount of core comonomer is small relative to the elastomeric monomer. Almost all of the core comonomer will be in the core. In the discussion that follows, the microgel shell will be referred to as a copolymer of the elastomeric monomer and acidic monomer (or mixture of acidic monomers) although it will be understood that some small amount of core comonomer may polymerize in the shell.

The amount of acidic monomer copolymerized with the elastomeric monomer should be enough to confer aqueous processibility to the microgel binder, but beyond that it should be minimized. That is, the ratio of acidic shell copolymer to elastomeric core homopolymer or copolymers should be as small as possible while maintaining aqueous processibility. This maximizes the amount of elastomeric polymer in the microgel and thus optimizes the elastic properties of the microgel binder. As discussed above, it is preferred that no more than 95% of the elastomeric monomer is polymerized in the core, and most preferably 60 to 90%.

A preferred core-shell microgel is one that has a core comprising a copolymer of styrene and butadiene wherein the styrene content is less than 10% and a shell comprising a copolymer of butadiene with an ethylenically unsaturated monomer or oligomer having acidic functionality. A more preferred core-shell microgel is one that has a core comprising a copolymer of styrene and butadiene wherein the styrene content is less than 10% and a shell comprising a copolymer of butadiene with acrylic acid or methacrylic acid. Also preferred is a core of polybutadiene and a shell comprising a copolymer of butadiene and acrylic acid or methacrylic acid.

The term 'microgel', as used herein, includes crosslinked spherical polymer molecules with a particle size of 0.01 to 1.0 micron in diameter prepared by emulsion polymerization. It is most desirable to use a microgel having a very thin shell. Thus the binder has large domains of essentially pure elastomeric polymer and will have very similar elastic properties to that polymer. When a basic compound is added to the microgel to neutralize the acidic functionality, the photosensitive material can be processed in tap water. For the following discussion, butadiene will be used as an example of an elastomeric monomer. However, it is understood that other elastomeric monomers can be used.

To prepare the core-shell microgel, the core butadiene homopolymer or copolymer, is first formed as a latex dispersion by emulsion polymerization. Emulsion polymerization generally refers to polymerization in an aqueous system in which a monomer such as butadiene or a mixture of butadiene and a core comonomer, is present in a dispersed second phase, resulting in polymer as a dispersed solid phase. The solid elastomeric polymer dispersion in aqueous solution is variously referred to as a rubber latex, elastomer latex, colloidal elastomer, or microgel dispersion. Very small polymer particles are produced and are typically submicron in size. Emulsion polymerization techniques are well known to those skilled in the art and discussions can be found in 'Emulsion Polymerization', I. Piirma and J. L. Gardon, eds., ACS Symposium Series, Vol. 24 (D.C., 1976); and 'Emulsion Polymers and Emulsion Polymerization', D. R. Bassett and A. E. Hamieliec, eds., ACS Symposium Series, Vol. 165 (D.C., 1981).

In general, the procedure to form the elastomeric polymer latex involves the formation of an oil/water emulsion that contains a polymerization catalyst and usually an emulsifier to stabilize the emulsion. The term 'oil' as used herein refers to a liquid that is substantially immiscible with water and forms a second phase. Such liquids are well known in this art area, e.g., ISOPAR. The catalyst can be present in either the oil or water phase. A small amount of crosslinking agent, such as allyl methacrylate, can also be present. However, the amount of crosslinking in the butadiene homopolymer or copolymer should be fairly low, i.e., less than about 10% crosslinked. Excessive crosslinking in the core can degrade the elastomeric properties of the microgel. Other materials that can be present in the emulsion are discussed in the references above.

After the emulsion is stabilized, the butadiene monomer is added to the emulsion and polymerization is initiated. Usually this is accomplished by the application of heat, typically 50° C. to 70° C. The core comonomer can be added to the stabilized emulsion before the elastomeric monomer is added or at the same time.

For the microgel binders used in practicing the invention, the butadiene is only partially polymerized at this point. It is preferred that less than about 95 wt % of the butadiene monomer is polymerized, and more preferably 60 to 90% is polymerized. At this point, a monomer having acid functionality is added to the reaction mixture. This monomer polymerizes with the remaining butadiene monomer to form a thin shell on the polybutadiene core.

The thus-formed elastomeric latex with core-shell microgel particles can be used as a latex to form the photosensitive resin layer by mixing with the other components of the photosensitive composition and using a device such as a dewatering extruder, as described in Kafka et al., U.S. Pat. No. 4,970,037. However, the liquid (i.e., water and the oil) can be removed from the latex to produce a solid binder prior to mixing with the other components. This can be done by dewatering extrusion or other well known techniques of coagulation, filtration, washing, and drying. Freeze drying and spray drying are also useful methods for practicing the present invention.

In addition to the core-shell microgel binder, there can also be one or more additional macromolecular polymeric binders. They can be added to improve the mechanical properties of the final flexographic printing plate, e.g., toughness, but should not deleteriously affect the desired elastic properties. The additional macromolecular polymeric binder may contain sufficient acidic or other groups so that the binder is also processible in an aqueous developer. Useful aqueous-processible binders have been disclosed in, e.g., U.S. Pat. Nos. 3,458,311; 4,273,857; and 4,293,635. Examples include acid-containing polymers or their salts; and amphoteric polymers such as interpolymers derived from N-alkylacrylamides or methacrylamides, acidic film-forming comonomers, and alkyl or hydroxyalkyl acrylates.

In general, the core-shell microgel binder or mixture of core-shell microgel binder and macromolecular polymeric binder will be present in an amount of about 40 to 95 wt %, relative to the total weight of the photosensitive layer, and preferably 70 to 90 wt %.

The microgel binder (3) comprising a mixture of an elastomer component and a hydrophilic polyamide that adsorbs on the elastomer component is now explained. This binder comprises A: a hydrophilic polymer and B: a rubber having a molecular weight of 40,000 or more, or A: a hydrophilic polymer and B: a solid rubber.

The 'hydrophilic' that distinguishes Component A means the properties of dissolving and/or dispersing in water, and includes those that decrease in weight or disintegrate as a result of the polymer being fully or partially eluted when a film formed from the polymer is immersed in water or hot water and abraded with a brush, etc., or the polymer being swollen and separated, and thereby dispersed in water. Because of the object of the present invention, it is preferable to use one that dissolves or, even if it does not dissolve, is swollen with 200 wt % or more of water relative to the polymer when a 0.5 mm thickness of the film is immersed in water at 25° C. for 1 hour.

With regard to such a hydrophilic polymer, polymers that can be dissolved in an alcohol and/or water can be cited; examples thereof include polyamide, partially saponified polyvinyl acetate, and celluloses, and from the viewpoint of compatibility with Component B, compatibility between the hydrophilic polymer and a photopolymerizable unsaturated compound, and abrasion resistance of the printing plate obtained, polyamide is preferably used in the present invention.

Preferred hydrophilic polyamides used in the present invention include polyamides having a sulfonic acid group or a sulfonate group in a side chain, a polyamide having an ether bond in the molecule, a polyamide having a piperidine skeleton, and a polyamide having an amino group in a side chain.

Examples of the polyamide having a sulfonic acid group or a sulfonate group in a side chain include a polyamide having a sulfonic acid group or a sulfonate group obtained, as disclosed in JP-A-48-72250, by copolymerization of sodium 3,5-dicarboxybenzenesulfonate, etc. with a normal starting material for a polyamide such as, for example, a lactam, an aminocarboxylic acid, a diamine, or a dicarboxylic acid. Examples of the polyamide having an ether bond in the molecule include polyamides obtained by copolymerizing at least one type of ether bond-containing dicarboxylic acid, diamine, aminocarboxylic acid, or lactam, and copolymerized polyamides containing a polyalkylene ether segment proposed in JP-A-55-74537. Examples of the polyamide having a piperidine skeleton include polyamides described in JP-A-50-7605 obtained by (co)polymerizing N,N'-di(γ-aminopropyl)piperazine and, if necessary, a dicarboxylic acid, a diamine, an aminocarboxylic acid, or a lactam. With regard to the polyamide having an amino group in a side chain, those with a tertiary amino group in the side chain are preferably used, and examples thereof include a ring-opening polymerized polymer of an α-(N,N'-dialkylamino)-ε-caprolactam, and a polyamide obtained by copolymerizing an α-(N,N'-dialkylamino)-ε-caprolactam and at least one type of diamine, aminocarboxylic acid, or lactam. Furthermore, with regard to the polyamide having a piperidine skeleton and the polyamide having an amino group in a side chain, those having the nitrogen atom quaternized with acrylic acid, etc. can be used.

Among these hydrophilic polyamides, polyamides having an ether bond in the molecule are preferably used, and those having an ether bond in the polyalkylene ether segment are more preferably used. With regard to the polyalkylene ether segment, those having a molecular weight of 150 to 1500 are yet more preferably used. With regard to a specific polyamide structure, a copolymerized polyamide containing 30 to 70 wt % of a constituent unit formed from an aliphatic dicarboxylic acid or a diamine and a polyoxyethylene that has an amino terminal group and whose polyether segment portion has a molecular weight of 150 to 1500 is preferably used.

These hydrophilic polymers can be used singly or in a combination of two or more types.

The rubber having a molecular weight of 40,000 or more and the solid rubber, which are Component B, are not particularly limited, and a rubber other than the so-called liquid rubber can be used.

The molecular weight of the rubber referred to here means the number-average molecular weight.

Examples of such rubbers include raw material rubbers or elastomers such as high molecular weight isoprene rubber, butadiene rubber, styrene-butadiene rubber, chloroprene rubber, nitrile rubber, butyl rubber, acrylic rubber, epichlorohydrin rubber, and silicone rubber, diene copolymers such as styrene-butadiene copolymer, styrene-isoprene copolymer, and butadiene-acrylic acid copolymer, olefin copolymers such as ethylene-propylene copolymer, and ethylene-vinyl acetate copolymer. Among these, from the viewpoint of aqueous ink resistance of the flexographic printing plate obtained, diene polymers and olefin copolymers are preferably used.

In order to achieve both aqueous developability of the printing plate materials and compatibility of the printing plate with an aqueous ink, it is preferable for the rubber to be dispersed independently in the photosensitive resin composition of the present invention. With regard to a method for dispersing the rubber in the photosensitive resin composition, a method comprising a step of melt mixing the hydrophilic polymer and the rubber to give a molten mixture is preferably employed. The melt mixing referred to here means mixing at least two types of polymers at a temperature that is higher than the softening points of these polymers. By carrying out melt mixing, rubber particles can be dispersed at a microscopic size throughout a continuous polymer matrix. Melt mixing can be carried out using a normal kneading device such as a Banbury mixer, a Brabender mixer, a kneader, or a twin shaft extruder. The temperature for melt mixing is preferably in the range of 100° C. to 250° C.

The mixing ratio of the hydrophilic polymer and the rubber in the polyamide binder used in the present invention is preferably 1:9 to 8:2 as a ratio by weight, and more preferably 1:9 to 5:5. When the proportion of the rubber added is in the above-mentioned range, the flexibility and the developability in neutral water of the resulting flexographic printing plate are improved.

The amount of hydrophilic polymer used is preferably 3 to 40 wt % of the total amount of the photosensitive resin layer, and more preferably 5 to 20 wt %. When it is equal to or greater than the lower limit of the above-mentioned range, the developability and the shape retaining properties as a raw plate of the flexographic printing starting plate material improve. When the amount is equal to or less than the upper limit of the above-mentioned range, the water resistance of the printing plate improves, swelling due to an aqueous ink is suppressed, and the printing resistance tends to improve.

The amount of rubber used is preferably 10 to 80 wt % of the total amount of the photosensitive resin layer, and more preferably 30 to 70 wt %. The rubber can be added to a molten mixture, or added as fine rubber particles such as a rubber emulsion or a rubber latex when formulating a photosensitive resin layer. When the amount of rubber added is in the above-mentioned range, the flexibility and the developability of the printing plate improve.

The total amount of the hydrophilic polymer, which is Component A, and the rubber, which is Component B, is preferably 20 to 90 wt % of the total amount of the photosensitive resin composition, and more preferably 50 to 80 wt %. When it is equal to or grater than the lower limit of the above-mentioned range, the tackiness of the plate surface obtained is low, and when it is made into a flexographic printing starting plate material, the shape retaining properties of the starting plate improve. When it is equal to or less than the upper limit of the above-mentioned range, the light sensitivity of the plate and, in particular, the image reproducibility, improve.

The polyamide binder may contain an unsaturated epoxy compound. By adding the unsaturated epoxy compound to a solution of a molten mixture of the hydrophilic polymer and the rubber so as to add the unsaturated epoxy compound to terminal carboxyl groups of the hydrophilic polymer and the rubber, photopolymerizability can be imparted to the polymer and rubber themselves; as a result the mesh structure of a relief made by a photopolymerization reaction with a photopolymerizable compound is formed with higher density, the relief thus obtained can have good water resistance and maintain a high degree of image reproducibility, and since the relief is tough it is possible to eliminate problems such as the occurrence of cracks during printing.

The monomer used in the photosensitive resin layer is now explained.

The photosensitive resin layer can contain a single monomer or a mixture of monomers, and they should be compatible with the binder so that a transparent, non-cloudy photosensitive resin layer can be obtained. Monomers that can be used in the photosensitive resin layer are well known in the present technical field, and include addition-polymerized ethylenically unsaturated compounds having a relatively low molecular weight (in general, lower than about 30,000), but are not limited thereto. It is preferable to use a monomer having a relatively low molecular weight that is less than about 5,000. Unless otherwise specified, the molecular weight referred to in this specification means the weight-average molecular weight.

Examples of suitable monomers are not limited but include mono- or poly-acrylate or methacrylate esters of alcohols and polyols (e.g., alkanols), such as t-butyl acrylate and lauryl acrylate, specific examples thereof including 1,4-butanediol diacrylate, 2,2,4-trimethyl-1,3-pentanediol dimethacrylate, and 2,2-dimethylolpropane diacrylate; alkylene glycols, tripropylene glycol diacrylate, butylene glycol dimethacrylate, hexamethylene glycol diacrylate, and hexamethylene glycol dimethacrylate; trimethylolpropane; ethoxylated trimethylolpropane; pentaerythritols such as pentaerythritol triacrylate; dipentaerythritol; and others.

Other examples of suitable monomers include isocyanates, esters, epoxides, and other acrylate and methacrylate derivatives, and specific examples thereof include decamethylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, and 1-phenylethylene-1,2-dimethacrylate. Yet more monomers can be found in Chen, U.S. Pat. No. 4,323,636; Fryd, et al., U.S. Pat. Nos. 4,753,865 and 4,726,877; and Feinberg, et al., U.S. Pat. No. 4,894,315.

The monomer is preferably added at at least 5 wt % of the photosensitive resin layer. In general, it is 5 to 50 wt %, and preferably 5 to 30 wt %, but in some cases it is preferably 10 to 80 wt %, and more preferably 10 to 60 wt %.

The proportion of the photopolymerizable unsaturated compound in the photosensitive resin layer is preferably in the range of 10 to 80 wt %. More preferably, it is 10 to 60 wt %. When the proportion of the photopolymerizable unsaturated compound in the photosensitive resin layer is equal to or greater than the lower limit of the above-mentioned range, since the density of the crosslinked structure formed by photopolymerization is sufficient, it is resistant to swelling in a thinner for the aqueous ink, which contains water as the main component, thereby suppressing destructive swelling of a solid printed surface and printing defects during printing. Moreover, since sufficient crosslinked density can be obtained by exposure, a desired image reproducibility tends to be obtained.

Conversely, when the proportion of the photopolymerizable unsaturated compound in the photosensitive resin layer is equal to or less than the upper limit of the above-mentioned range, the density of the crosslinked structure formed by photopolymerization is not too high, and the strength of the relief from plate making is sufficient, thereby preventing cracks from occurring in the relief during printing.

The photopolymerization initiator used in the photosensitive resin layer of the present invention is now explained.

The photopolymerization initiator can be a single compound or a combination of compounds, is sensitive to radiation, and generates free radicals that initiate polymerization of a monomer or a plurality of monomers. The photopolymerization initiator is generally sensitive to visible light or ultraviolet light, and preferably to ultraviolet light. Furthermore, the photopolymerization initiator is preferably thermally insensitive at 185° C. or below. Examples of suitable photopolymerization initiators include substituted or unsubstituted polynuclear quinones, aromatic ketones, benzoin, benzoin ethers, and 2,4,5-triarylimidazoyl dimers, benzophenones, benzils, acetophenones, and diacetyls. Examples of suitable systems are described in Grueetzmacher, U.S. Pat. No. 4,460,675 and Feinberg, et al., U.S. Pat. No. 4,894,315.

The photopolymerization initiator is generally preferably used at 0.001 to 15.0 wt % relative to the weight of the photopolymerization composition, more preferably about 0.01 to 10 wt %, and particularly preferably 0.1 to 5.0 wt %.

The photosensitive resin layer can employ other additives related to desired final properties. Examples of such additives include a sensitizer, a plasticizer, a rheology modifying agent, a thermal polymerization inhibitor, a tackifier, a coloring agent, an antioxidant, an ozone degradation inhibitor, an antistatic agent, an ultraviolet absorbing agent, a reinforcing agent, a compatibility aid, a surfactant, an antifoaming agent, a fragrance, and a filler. The amount of other additives added is generally preferably 10 wt % or less of the total weight of the photosensitive resin layer, and more preferably 5 wt % or less.

The plasticizer is used in order to adjust the coating formation properties of the elastomer. Examples of suitable plasticizers include an aliphatic hydrocarbon oil such as, for example, a naphthene oil or a paraffin oil; a liquid polydiene such as, for example, liquid polybutadiene; and liquid polyisoprene. In general, a plasticizer is a liquid having a molecular weight of less than about 5,000, but it can have a molecular weight of up to about 30,000. Low molecular weight plasticizers include those having a molecular weight of less than about 30,000.

With regard to the compatibility aid for the hydrophilic polymer and the photopolymerizable unsaturated compound, there can be added polyhydric alcohols such as ethylene glycol, diethylene glycol, triethylene glycol, glycerol, trimethylolpropane, and trimethylolethane, N-ethyl-p-toluenesulfonamide, N-butylbenzenesulfonamide, N-methylbenzenesulfonamide, etc. These polyhydric alcohols and sulfonamide compounds have the effect of preventing the occurrence of relief cracks by increasing the flexibility of a section cured by photopolymerization. Such polyhydric alcohols and sulfonamide compounds can be used at 30 wt % or less relative to the photosensitive resin layer.

With regard to the thermal polymerization inhibitor, phenols, hydroquinones, catechols, etc. can be cited. These thermal polymerization inhibitors can be used in the range of 0.001 to 5 wt % relative to the total amount of the photosensitive resin layer.

The photosensitive resin layer employing a core-shell microgel binder can contain a basic compound. The basic compound can be of any type, and is added when it is required to develop a photosensitive flexographic plate using tap water. The basic compound neutralizes an acidic functional group of the microgel shell, thus enabling the microgel binder to be developed in plain water. This basic compound is an inorganic base or a basic organic compound such as an amine. Examples of suitable inorganic bases include hydroxides of metals of groups IA and IIA. Examples of suitable organic bases include primary, secondary, or tertiary amines such as C2 to C12 alkylamines or arylamines, C2 to C12 alkyl or aryl di- or tri-amines, alkanolamines, and aminodiols.

One preferred basic compound is a nitrogen-containing compound having at least one ethylenically unsaturated group. The photosensitive composition comprising these types of basic compounds gives a flexographic printing plate having improved resistance to the water-based ink. In particular, (meth)acrylates, (meth)acrylamides, and compounds containing both a (meth)acryloylcarbamate group and an amino group are appropriate. Examples of suitable compounds include dialkylaminoalkyl acrylates and methacrylates, dialkylaminoalkyl acrylamides and methacrylamides, and dialkylaminoalkyl acryloylcarbamates and methacryloylcarbamates, each alkyl group having 1 to 6 carbon atoms. It is also possible to use a combination of basic compounds.

The basic compound can be added at almost any time during preparation of the flexographic printing starting plate, that is, the compound can be added (a) immediately after the formation of a microgel in a latex, (b) after the microgel binder is separated from water in the latex, or (c) at the same time as other components of the photosensitive resin layer are added. The amount of basic compound added should be sufficient to neutralize acidic functional groups so that the photosensitive composition becomes water soluble. The molar ratio of the basic compound added relative to the acidic monomer in the copolymer shell is normally in the range of 1:2 to 2:1. In general, the basic compound is present in an amount of about 1 to 15 wt % of the total weight of the photosensitive resin layer.

Preferred processes for producing a polyamide binder photosensitive resin layer used in the present invention are described below. As described above, a molten mixture of a hydrophilic polymer and a rubber is prepared. A polymerizable monomer component and a photopolymerization initiator component are further mixed with the molten mixture, thus giving a polyamide binder photosensitive resin layer used in the present invention. The timing of addition of the polymerizable monomer component and the photopolymerization component can be simultaneous, or either can be added first.

With regard to a method for mixing the molten mixture with other components, for example, the molten mixture of the hydrophilic polymer and the rubber is dissolved in a mixed solvent such as water/alcohol while heating. A part or the whole of the hydrophilic polymer is dissolved in the step above, and micro-dispersed rubber is dispersed in the solvent. An unsaturated epoxy compound is added as necessary to this solution, thereby effecting an addition reaction to the polymer. A photopolymerizable unsaturated compound, a photopolymerization initiator and, as necessary, a thermal stabilizer are further added and stirred, and mixed well to give a solution comprising a photosensitive resin for a printing plate.

The photosensitive resin layer is formed into a single layer, multiple layers having the same composition, or two or more layers having different compositions. In general, the different layers should have an identical or similar binder, but the concentration of each component, the types of monomer and photopolymerization initiator, and the additives can be different.

The thickness of the photosensitive resin layer can be varied over a wide range in relation to the type of desired flexographic printing plate. For a so-called 'thin plate', the thickness of the photosensitive resin layer can be about 0.05 to 0.17 cm. For a thicker plates, the thickness of the photosensitive resin layer can be increased to 0.25 to 0.64 cm or more. In general, the photosensitive resin layer contains one or more compounds that can move to the surface or an adjacent layer of the photosensitive resin layer. In general, a low molecular weight compound, that is, a molecular weight less than 30,000, is a mobile substance. Mobile, low molecular weight compounds are mainly liquids but include low melting point substances. Examples of such mobile substances include monomers and plasticizers. These mobile substances tend to move over time when they are compatible with a substance in an adjacent layer.

The photosensitive resin layer used in the present invention preferably has a surface resistivity of $1 \times 10^{10}$ $\Omega/\square$ or more, and more preferably $2 \times 10^{10}$ $\Omega/\square$ or more. Its upper limit is preferably $1 \times 10^{18}$ $\Omega/\square$ or less. The photosensitive resin layer having a surface resistivity of $1 \times 10^{10}$ $\Omega/\square$ or more has high charging efficiency and high charge uniformity, thereby forming a high quality mask image.

In the present invention, the surface resistance is the resistance value measured by the measurement method below.

A flexographic plate is set in a measurement chamber of an MMAII-17A Universal Electrometer manufactured by Kawaguchi Denki K.K. at a temperature of 20° C. and a humidity of 65% RH, wiring is carried out in surface resistivity measurement mode, the measurement voltage of the electrometer is set at 100 V, and the resistance is measured 1 minute after application of the voltage.

The above-mentioned solution of the photosensitive resin composition for a printing plate is applied on a support as a photosensitive resin layer to give a flexographic printing starting plate. In order to form the photosensitive resin layer, for example, after distilling off most of the solvent, it is heated into a molten state and molded by extrusion onto the support. Alternatively, a photosensitive sheet is formed by a dry film forming method, and this sheet can be bonded to a support to give a photosensitive resin layer. It is also possible to obtain a photosensitive resin layer by dry film forming directly on a support. By coating a support in this way with the photosensitive resin composition used in the present invention, a flexographic printing starting plate can be obtained.

In the present invention, a step subsequent to the formation of a mask image on the flexographic printing starting plate is a step of overall exposure of the flexographic printing starting plate to radiation through the mask.

The type of radiation used depends on the type of photopolymerization initiator in the photosensitive resin layer. Since the mask image formed on the surface of the photosensitive resin layer prevents material present immediately below the mask image from being exposed to radiation, the photosensitive resin layer in a region where the mask image is formed (a region covered by a radiation-opaque material) will not be polymerized. The photosensitive resin layer in a region that is not covered with the radiation-opaque material is exposed to radiation and polymerized.

With regard to a light source used for the exposure step, any normal light source for radiation can be used. Examples of suitable visible or UV light sources include a carbon arc, a mercury vapor arc, a fluorescent lamp, an electron flash unit, an electron beam unit, and a photographic flood lamp. The most suitable UV light source is a mercury vapor lamp, and particularly a sun lamp. A standard light source is a Sylvania 350 black light fluorescent lamp (FR 48T 12/350 VLNHO/180, 115 W), and this has a central radiation wavelength of around 354 nm.

The overall exposure to radiation may be carried out on a flat platform, but a drum can also be used.

The time of exposure to radiation can be varied from a few seconds to several minutes depending on the strength of the radiation, the spectral energy distribution, the distance from the masked flexographic printing starting plate, and the properties and the amount of the photosensitive resin composition. The mercury vapor arc or the sun lamp is typically used at a distance of about 3.8 to 153 cm from the photosensitive flexographic plate. The exposure temperature is preferably room temperature or slightly higher than room temperature, that is, about 20° C. to 35° C.

Image formation exposure of the flexographic printing starting plate by radiation is normally carried out in a vacuum in order to eliminate the influence of oxygen in the atmosphere. The exposure is carried out in a vacuum in order to ensure adhesion between the starting plate (e.g., a negative) and the photopolymerizable surface and prevent oxygen from adversely affecting a polymerization reaction in the photosensitive resin layer (when oxygen is present, the polymerization reaction requires a long exposure time and a strong light source, and the resulting reproducibility is poor). However, in the process of the present invention, the overall exposure step can be carried out in a vacuum or without vacuum, that is, exposure of the masked flexographic printing starting plate can be carried out in the presence of atmospheric oxygen. The fact that the overall exposure step can be carried out without vacuum is surprising when taking into consideration the absence in the flexographic printing starting plate of a barrier layer for preventing oxygen from affecting polymerization. The overall exposure without vacuum of the flexographic printing starting plate improves one characteristic of the product: the side wall of the plate relief structure is linear over a wide range of exposure times, that is, a wide exposure latitude is given. In general, in the exposure step, a wide exposure latitude is advantageous. Another advantage of carrying out the overall exposure step without vacuum is that since time for creating the vacuum is not required prior to exposure, the process becomes simpler and quicker.

The process of the present invention preferably comprises a back exposure or back flash exposure step. This is overall exposure to radiation from the support side of the flexographic printing starting plate. This is used for generating a shallow layer or base of polymerized material on the support side of the photosensitive resin layer, and sensitizing the photosensitive resin layer. This base improves adhesion between the photosensitive resin layer and the support, improves the resolution of dots in highlight areas, and determines the depth of the plate relief. Back flash exposure can be carried out before, after, or during the image formation process. The back flash exposure step can employ any of the normal light sources above. The back flash exposure time is generally in the range from a few seconds to about 1 minute.

After overall exposure by UV light through the image mask formed from the radiation-opaque material, a washing treatment is carried out using an appropriate liquid developer. This treatment step is for removing the photosensitive resin layer in a region that at least has not been exposed to non-infrared radiation. That is, the liquid developer removes the unphotopolymerized region of the photosensitive resin layer.

The development is usually carried out at around room temperature. The liquid developer can be an organic solution, water, or an aqueous or semi-aqueous solution. When water is used as the liquid developer, this water can contain a surfactant. The liquid developer is selected depending on the chemical properties of the photosensitive resin that is to be removed. Examples of suitable organic developing solutions include aromatic or aliphatic hydrocarbon solutions, aliphatic or aromatic halohydrocarbon solutions, and mixtures of such solutions with an appropriate alcohol. Other organic liquid developers are described in German Patent Application Laid-open No. 38 28 551 and U.S. Pat. No. 5,354,645. An appropriate semi-aqueous liquid developer usually contains water, a water-miscible organic solution, and an alkaline material. An appropriate aqueous liquid developer usually contains water and an alkaline material. Other appropriate combinations of aqueous liquid developers are described in U.S. Pat. No. 3,796,602.

Although the developing time varies, it is preferably in the range of about 2 to 25 minutes. The liquid developer can be applied by any standard method including immersion and application involving a spray, a brush or a roller. A brushing aid can be used in order to remove an unpolymerized portion of the composition. However, in an automated processing unit wash-out is often employed, and this employs a liquid developer and mechanical brushing in order to remove unexposed areas of the plate and leave a relief comprising an exposed region and the base.

Following dissolution development the flexographic printing plate is dried, usually by blotting or wiping, and then dried by forced air or in an infrared oven. The drying time and temperature vary, but the plate is typically dried at 60° C. for 60 to 120 minutes. High temperatures can give rise to registration problems due to shrinkage of the support, and is therefore not recommended. Most flexographic printing plates are subjected to uniform post exposure in order to complete the photopolymerization process and stabilize the plate during printing and storage. This post exposure step employs the same light source as that used in the main exposure.

Detackification (also called photo-finishing) is an optional post development treatment, and this can generally be applied when the surface is tacky and this tackiness is not removed after post exposure. The tackiness can be removed by a well known method such as a method involving treatment with bromine water or chlorine water. Such a treatment is described in, for example, Grueetzmacher, U.S. Pat. No. 4,400,459; Fickes, et al., U.S. Pat. No. 4,400,460, and German Patent No. 28 23 300. Detackification can also be achieved by exposure to a light source having a wavelength of less than 300 nm as described in EP Application Laid-open No. 0 017 927, and Gibson, U.S. Pat. No. 4,806,506.

These flexographic printing plates can be used conveniently for the formation of a flexographic printing plate for a seamless, continuous print. The photopolymerizable flat sheet-shaped flexographic printing plate can be processed by wrapping the flexographic printing plate around a cylindrical shape, which is usually a print sleeve or a print cylinder itself, and melt-bonding opposite edges so as to give a seamless, continuous flexographic printing plate. In a preferred method, the photopolymerizable layer is wrapped around a cylindrical shape and opposite edges thereof are bonded. One method for bonding opposite edges is described in German Patent DE 28 44 426. This photopolymerizable layer can then be coated with at least one infrared sensitive layer by, for example, a spray coating method.

The flexographic printing plate for continuous printing finds application in a flexographic print having a continuous design, such as wall paper, and wrapping paper for decoration or gifts. Moreover, such a flexographic printing plate for a continuous print is most suitably mounted in a normal laser system. A sleeve or cylinder around which is wrapped a flexographic printing plate for a print, with opposite edges thereof melt-bonded, can be mounted directly in the laser system, and functions as a rotating drum during a laser exposure step.

Furthermore, it can be appreciated that the process of the present invention can be carried out with the flexographic printing plate attached to the cylinder, that is, in a state in which the flexographic printing plate is wrapped around the cylinder. It is therefore possible to carry out imagewise ablation, overall exposure, development, and additional steps while the plate is attached to the cylinder. Other advantages of the present process include an increase in the processing speed, good plate surface alignment, and a reduction, and in some cases elimination, of the mounting time.

Unless otherwise specified, the terms 'flexographic printing plate or flexographic plate' include any shape of plate and flexographic plate appropriate for a flexographic print, including, although not limited to, a flat sheet and a seamless, continuous shape. The publications/documents described herein are incorporated by reference unless otherwise specified.

In accordance with the present invention, there is provided a plate-making process for making a flexographic printing plate at low running costs with good mask image density, charge stability, and charge uniformity.

EXAMPLES

Examples of the present invention are illustrated below, but the present invention is not limited thereby.

Abbreviations used in the explanation below are as follows:

Base 1 Diethylaminoethyl methacrylate
AMA Allyl methacrylate
BD Butadiene
BHT Butylated hydroxyl toluene
BMA Butyl methacrylate
Blue 3R-RF Mixture of 90% of MACROLEX (™) BLUE RR, Cl Solvent Blue 97, and 10% of MACROLEX (™) VIOLET B, Cl Solvent Violet 13, both manufactured by Mobay Chemical
CP-1216 Latex of 2.8 parts of poly(vinylidene chloride/itaconic acid/methyl acrylate) and 1 part of poly(ethyl acrylate)
DAM Diallyl maleate, manufactured by MTM-Hardwicke, Inc.
DDM Dodecylmercaptan
t-DDM Tertiary-dodecylmercaptan
Dresinate (™) 731 70% aqueous solution of sodium soap of modified resin, CAS No. 61790-51-0, manufactured by Hercules, Inc.
HMDA 1,6-Hexanediol diacrylate
HEC Hydroxyethyl cellulose, HEC WP-09-L, manufactured by Union Carbide
HPC Hydroxypropyl cellulose, Klucel (™) E-F, manufactured by Hercules, Inc.
Initiator 2-Phenyl-2,2-dimethoxyacetophenone
Polymerization inhibitor 2,3-Diazabicyclo[3.2.2]non-2-ene, 1,4,4-trimethyl-N,N'-dioxide, CAS No. 34122-40-2
ISOPAR V C14 to C18 isoparaffinic hydrocarbons, CAS No. 64742-46-7, manufactured by Exxon Co.
LOMAR PW Naphthalenesulfonic acid formaldehyde polymer, sodium salt, CAS No. 9084-064, manufactured by Henkel Corp.
MAA Methacrylic acid
MMA Methyl methacrylate
NaDDBS Sodium dodecylbenzenesulfonate
76RES-P546 Vinylidene chloride/acrylate copolymer latex, manufactured by UNOCAL Chemicals
NLA n-Lauryl acrylate
Piccotex (™) Substituted polystyrene, manufactured by Hercules, Inc.
PVP-VA Poly(vinylpyrrolidone/vinyl acetate)
Rodo No. 0 A mixed oil used as an odor masking agent, manufactured by RT Vanderbilt Inc.
TBP Tributoxyethyl phosphate
Tinuvin (™) 1130 Mixture of polyethylene glycol mono(2-(2H-benzotriazol-2-yl)-6-t-butyl-4-(3-methoxy-3-oxypropyl)phenyl)ether and polyethylene glycol bis(2-2 (2H-benzotriazol-2-yl)-6-t-butyl-4-(3-methoxy-3-oxypropyl)phenyl)ether, manufactured by Ciba-Geigy Ltd.
TKPP Tetrapotassium pyrophosphate, manufactured by Monsanto Company
VAZO (™) 67 2,2'-Azo-bis(2-methylbutyronitrile), manufactured by du Pont
Zapon (™) 335 Red colorant, CAS No. 73297-15-1
TAMOL (™) SN Sodium naphthalenesulfonate, manufactured by Rohm and Haas UV absorber 2-[3',5'-Bis(1-methyl-1-phenylethyl)-2'-hydroxyphenyl]benzotriazole Preparation of Flexographic Printing Starting Plate Flexographic printing starting plates having photosensitive resin layers containing the five kinds of photosensitive resins below were used; an image mask pattern was formed on each of the photosensitive resin layers using a carbon black-containing ink by an electrostatic ink-jet method, and they were exposed and developed.

Photosensitive Resin 1

A Cyrel (™) flexographic plate, type 67HLS, manufactured by du Pont was used with its coversheet and release layer removed.

Photosensitive Resin 2

A Cyrel (™) flexographic plate, type HOS45, manufactured by du Pont was used with its coversheet removed.

Photosensitive Resin 3

A flexographic plate having an aqueous developable photosensitive resin layer prepared as below was used without any coversheet.

The flexographic plate having the aqueous developable photosensitive resin layer employed a microgel binder prepared as follows:

I. Preparation of Microgel Binder

A. Preparation of Water Phase Solution

The water phase solution was composed of the following components:

| | |
|---|---|
| LOMAR PW | 56 g |
| NaDDBS | 239 g |
| Deionized water | 13,093 g |

LOMAR PW and NaDDBS were added to the water under a nitrogen atmosphere. The components were mixed until they were dissolved.

B. Preparation of Oil Phase

The oil phase solution was composed of the following components:

| | |
|---|---|
| Styrene | 1,332 g |
| DDM | 56 g |
| VAZO (registered trademark) 67 | 35 g |
| ISOPAR V | 2,244 g |
| DAM | 140 g |

The DDM and DAM were dissolved in styrene under a nitrogen atmosphere. The VAZO (™) 67 was then added and allowed to dissolve. The ISOPAR V was slowly added to the styrene solution while under a nitrogen atmosphere.

C. Preparation of Oil Emulsion

The oil phase was added to the water phase, under a nitrogen atmosphere, keeping the solution mixed. This was then homogenized using a MICROFLUIDIZER (™) M210 (manufactured by Microfluidics Corp.) at 3,000 to 6,000 psi (211 to 422 kg/cm$^2$) until the particle size measured 100 to 250 nm (Gaussian distribution; NiComp Submicron Particle Size Analyzer, Model 270, manufactured by Pacific Scientific).

D. Butadiene Polymerization

The following composition was used for the polymerization:

| | |
|---|---|
| Deionized water | 35,830 g |
| Oil emulsion | 23,590 g |
| FeSO$_4$ | 0.02 g |
| TKPP | 33.00 g |
| BD | 19,590 g |

The FeSO$_4$ and TKPP were dissolved in the deionized water under a nitrogen atmosphere. The oil emulsion was added and this was placed in an autoclave. The BD was added and allowed to swell the oil emulsion droplets for one hour while stirring. The temperature was then raised to 60° C. to 65° C. to initiate the polymerization reaction. Polymerization was allowed to proceed until approximately 85% of the BD had polymerized.

The following components were premixed and poured in at approximately 85% conversion of the BD.

| | |
|---|---|
| MAA | 1,030 g |
| t-DDM | 294.8 g |
| NaDDBS | 140.6 g |
| Deionized Water | 10,190 g |

The reaction proceeded to completion with approximately 90% to 95% total conversion. The resulting polymer Mooney viscosity was 65. The final particle size was 144 nm (Gaussian distribution; NiCOMP Submicron Particle Size Analyzer, Model 270, manufactured by Pacific Scientific).

The above emulsion was freeze dried to remove the water. The result was a solid microgel binder having a core of poly(butadiene/styrene) and a shell of poly(butadiene/methacrylic acid). The percent MM was 3.9%.

II. Preparation of Flexographic Printing Starting Plate Containing Aqueous Developable Photosensitive Resin Layer Photosensitive resin layer 3 was prepared using the components below.

| | |
|---|---|
| Microgel binder (prepared in A to D) | 65.1 parts by weight |
| HMDA | 4.0 parts by weight |
| NLA | 4.9 parts by weight |
| Base 1 | 9.8 parts by weight |
| TBP | 4.9 parts by weight |
| Initiator | 3.0 parts by weight |
| BHT | 2.0 parts by weight |
| Polymerization inhibitor | 0.1 parts by weight |
| Piccotex (registered trademark) | 5.0 parts by weight |
| PVP-VA | 1.0 part by weight |
| Zapon (registered trademark) 335 | 0.01 parts by weight |
| Tinuvin (registered trademark) 1130 | 0.1 parts by weight |
| Rodo (registered trademark) No.0 | 0.1 parts by weight |

A coversheet was prepared by coating a 0.013 cm thick polyethylene terephthalate sheet with a mixture of HPC and HEC at a coating weight of 20 mg/dm$^2$. As the support, a 0.018 cm thick flame-treated polyethylene terephthalate was used. The components of the photosensitive resin layer were fed to a 30 mm twin screw extruder that carried out the functions of mixing, defoaming, and filtration of the composition. The material was extruded through a die at 135° C. into the rotating bank of a two-roll calender, and calendering was then carried out between the support film and the coversheet.

When forming an image mask, the above-mentioned coversheet was removed before use.

After an image mask was formed, the masked flexographic printing starting plate was subjected to surface exposure without vacuum for 3 minutes, that is, it was exposed via the radiation-opaque image mask so formed. The masked flexographic printing starting plate thus exposed to light was developed in a rotary brush processing machine with tap water at room temperature for 10 minutes. The unpolymerized photosensitive resin layer was removed as expected. The plate was rinsed with fresh water, and then dried in an oven at 60° C. for 15 minutes. A good image was obtained.

Photosensitive Resin 4

A flexographic printing starting plate having an aqueous developable photosensitive resin layer prepared as below was used without any coversheet.

Preparation of a composite binder used in Photosensitive resin 4 is illustrated below.

A. Preparation of Water Phase Solution

The water phase solution was composed of the following components:

| Dresinate 731 | 1,298 g |
|---|---|
| NaOH | 38 g |
| Tamol SN | 282 g |
| NaDDBS | 1,279 g |
| Deionized water | 69,267 g |

The Dresinate 731 and NaOH were dissolved in water with a nitrogen sparge. NaDDBS and Tamol SN were added to this solution under a nitrogen atmosphere. The components were mixed until they were dissolved.

B. Preparation of Oil Phase

The oil phase solution was composed of the following components:

| Styrene | 6,711 g |
|---|---|
| DDM | 282 g |
| VAZO 67 | 176 g |
| ISOPAR V | 11,304 g |
| AMA | 706 g |

The DDM and AMA were dissolved in styrene under a nitrogen atmosphere. The VAZO 67 was then added and allowed to dissolve. The ISOPAR V was slowly added to the styrene solution while under a nitrogen atmosphere.

C. Preparation of Oil Emulsion

The oil phase was added to the water phase, under a nitrogen atmosphere, keeping the solution mixed. This was then homogenized using a Microfluidizer (™) M210 (manufactured by Microfluidics Corp.) at 210.9 to 421.8 kg/cm$^2$ until the particle size measured 100 to 250 nm (measured by a B190 manufactured by Brookhaven Instrument Co.).

D. Butadiene Polymerization

The following composition was used for the polymerization:

| Deionized water | 125,500 g |
|---|---|
| Oil emulsion | 91,260 g |
| FeSO$_4$ | 0.06 g |
| TKPP | 130.1 g |
| BD | 78,020 g |

The FeSO$_4$ and TKPP were dissolved in the deionized water under a nitrogen atmosphere. The oil emulsion was added and this was placed in an autoclave. The BD was added and allowed to swell the oil emulsion droplets for one hour while stirring. The temperature was raised to 60° C. to 65° C. to initiate the polymerization reaction. Polymerization was allowed to proceed to completion with approximately 90% to 95% BD conversion. The resulting polymer Mooney viscosity was 69. The final particle size was 196 nm (Gaussian distribution; Nicomp particle size analyzer, Model 270, manufactured by Pacific Scientific).

E. Polymeric Stabilizer

The polymer used was a group transfer polymer consisting of BMA (10 molecular units)/MMA (5 molecular units)/MAA (10 molecular units). The polymer was prepared in tetrahydrofuran (THF). To this was added 1-propanol and water resulting in a mixture having 13 parts of the polymer, 9 parts of THF, 6 parts of 1-propanol, and 70 parts of water. Then 75% of the acid functional groups were neutralized with KOH.

F. Composite Binder 135 g of the polymeric stabilizer solution (13% solids) was mixed with 1,049 g of the elastomeric latex (31.7% solids) for 24 hours. The resulting emulsion was freeze dried below 0° C. to remove the water. The result was a solid composite binder having a butadiene/styrene copolymer elastomer with adsorbed BMA/MMA/MM polymeric stabilizer.

Photosensitive resin layer 4 was prepared from the following components:

| Composite binder | 88.2 parts by weight |
|---|---|
| HMDA | 10 parts by weight |
| Initiator | 1.2 parts by weight |
| BHT | 0.5 parts by weight |
| Polymerization inhibitor | 0.1 parts by weight |

The components above were mixed in a two-roll mill at 115° C. to 120° C. for 8 minutes. A coversheet was prepared by coating a 0.013 cm thick polyethylene terephthalate sheet with a layer of a mixture of 1 part of HEC and 1 part of HPC at a coating weight of 20 mg/dm$^2$.

A support was prepared by coating a 0.018 cm thick Cronar polyethylene terephthalate support sheet, which contained 0.24% of UV absorber and 0.57% of Blue 3R-RF, with a first layer of CP-1216 at a coating weight of 0.8 mg/dm$^2$ and a second layer of 76RES P546 at a coating weight of 70 mg/dm$^2$. The mixed photosensitive composition was placed between the support and the coversheet and placed in a hydraulic press at 140° C. and pressed out to form a total thickness (photosensitive layer+support+coversheet) of 0.28 cm.

Photosensitive Resin 5

Preparation of a hydrophilic binder used in Photosensitive resin 5 is illustrated below.

Parts used in the Examples below mean parts by weight, and number-average molecular weights are values determined from a combination of a viscosity measurement method and a GPC method unless otherwise specified. The relative viscosity [ηr] is a value obtained by dissolving a polymer in 98% sulfuric acid at 1 g/1 00 cc and measuring at 25° C.

Synthesis Example A-1

Synthesis of Polyamide Having Ether Bond

A polyamide copolymer was obtained from ε-caprolactam/equimolar adipic acid salt of hexamethylene diamine/equimolar adipic acid salt of α,ω-diaminopropyl polyoxyethylene (number-average molecular weight 1,000) (20/20/60 ratio by weight).

The terminal groups of the polyamide copolymer obtained here were measured quantitatively, and it was found that there were $4.0 \times 10^{-5}$ mol/g primary amino groups and $2.1 \times 10^{-5}$ mol/g carboxyl groups, and the number-average molecular weight was about 33,000 from the quantitative determination of the terminal groups. This polymer had the property of dissolving in water at 25° C.

20 parts of the polyamide copolymer obtained in Synthesis Example A-1, and 80 parts of a carboxyl group-modified nitrile butadiene rubber (Nipol 1072, number-average molecular weight 500,000, manufactured by Nippon Zeon Corporation) were mixed in a sealed mixer operated at 180° C. to give a molten mixture.

The configuration of this molten mixture was examined using a scanning electron microscope (JSM-T300, manufactured by JEOL; measurement conditions: reflection electronic composite image). It was found that the mixture had a sea/island dispersed structure in which the A-1 polymer was the sea and the carboxylated nitrile butadiene rubber formed islands, and their diameters were in the range of 0.5 to 4 micron.

60 parts of this molten mixture was dissolved by heating in 160 parts by weight of a 60/40 (parts by weight) mixed solvent of ethanol/water at 90° C.

Subsequently, 2 parts by weight of glycidyl methacrylate was added, and a reaction was carried out at 80° C. for 1 hour so as to react the epoxy groups of the glycidyl methacrylate with terminal amino and carboxyl groups of the polyamide, thereby introducing methacryloyl groups into the polyamide termini. Subsequently, 30 parts by weight of β-hydroxyethyl-β'-acryloyloxyethyl phthalate was added as a photopolymerizable unsaturated compound and, furthermore, 2 parts by weight of dimethyl benzil ketal as a photopolymerization initiator, 0.1 parts by weight of hydroquinone monomethyl ether as a thermal polymerization inhibitor, and 6 parts by weight of sodium methylenebisnaphthalenesulfonate were added and mixed well.

A solution formed from the photosensitive resin composition thus obtained was cast on a 100 μm thick polyester substrate, which had been precoated with a polyester adhesive and cured, and the cast solution was cured so that the thickness of the photosensitive layer was 1,700 μm, and allowed to stand at room temperature to give a solid flexographic printing starting plate having a compression strength of 4 kg/cm$^2$ as a raw plate.

The configuration of this flexographic printing starting plate was examined using a scanning electron microscope (JSM-T300, manufactured by JEOL; measurement conditions: reflection electronic composite image). It was found that the plate had a sea/island structure in which the A-1 polymer and the photopolymerizable unsaturated compound formed the sea and the carboxylated nitrile butadiene rubber formed islands, and their diameters were in the range of 0.5 to 4 micron.

Photosensitive Resin 6

A Cyrel (™) flexographic printing plate, type HOS45, manufactured by du Pont was used without removing the coversheet.

Preparation of Ink Composition 10 g of a carbon black pigment (MA-200RB manufactured by Mitsubishi Chemical Corporation) and 20 g of a coating agent [AP-1] were placed in a PBV-0.1 desk-top kneader manufactured by Irie Shokai K.K., and mixed by heating at a heater temperature of 100° C. for 2 hours. 30 g of the mixture thus obtained was roughly ground in a Trio blender manufactured by Trioscience K.K., and further finely ground in a Model SK-M10 sample mill manufactured by Kyoritsu Riko K.K. 30 g of the finely ground substance thus obtained was predispersed together with 7.5 g of a dispersant [BZ-2], 75 g of ISOPAR G, and glass beads having a diameter of about 3.0 mm in a paint shaker manufactured by Toyo Seiki Co., Ltd. After removing the glass beads, dispersion (particle formation) was carried out together with zirconia ceramic beads having a diameter of about 6.0 mm in a Type KDL Dynomill manufactured by Shinmaru Enterprise K.K. at a rotational speed of 2,000 rpm while maintaining the internal temperature at 25° C. for 5 hours, and subsequently at 45° C. for 8 hours. The zirconia ceramic beads were removed from the dispersion thus obtained, and 316 g of ISOPAR G and 0.6 g of a charge adjusting agent [CT-1] were added to give an ink composition. The physical properties of the ink composition were as follows.

The electrical conductivity of the ink composition at 20° C. was measured using an LCR meter (AG4311 manufactured by Ando Electric Co., Ltd.) and electrodes for a liquid (Model LP-05 manufactured by Kawaguchi Electric Works Co., Ltd.) at an applied voltage of 5 V and a frequency of 1 kHz, and it was found to be 100 nS/m.

The ink composition was subjected to centrifugal separation using a small scale high speed cooled centrifuge (SRX-201 manufactured by Tomy Seiko Co., Ltd.) at a rotational speed of 14,500 rpm and a temperature of 20° C. for 30 minutes, thus making the charged particles settle out. The electrical conductivity of the supernatant liquid was measured, and it was found to be 30 nS/m. The electrical conductivity of the charged particles was 70 nS/m, which was 70% of the electrical conductivity of the ink composition. Furthermore, the charge of the charged particles was positive.

The volume-average diameter of the charged particles was measured using a CAPA-700 manufactured by Horiba Ltd. at a rotational speed of 5,000 rpm, and it was found to be 2.0 μm. The number-average diameter was 0.15 μm.

The viscosity of the ink composition at 20° C. was measured by a Model E viscometer manufactured by Tokyo Keiki K.K., and it was found to be 1.5 mPa·s. The surface tension of the ink composition at 20° C. was measured using a FACE automatic surface tension meter manufactured by Kyowa Kaimen Kagku K. K., and it was found to be 25 mN/m.

The structural formulae of the coating agent [AP-1], the dispersant [BZ-2], and the charge adjusting agent [CT-1] used in the formation of the ink composition are shown below.

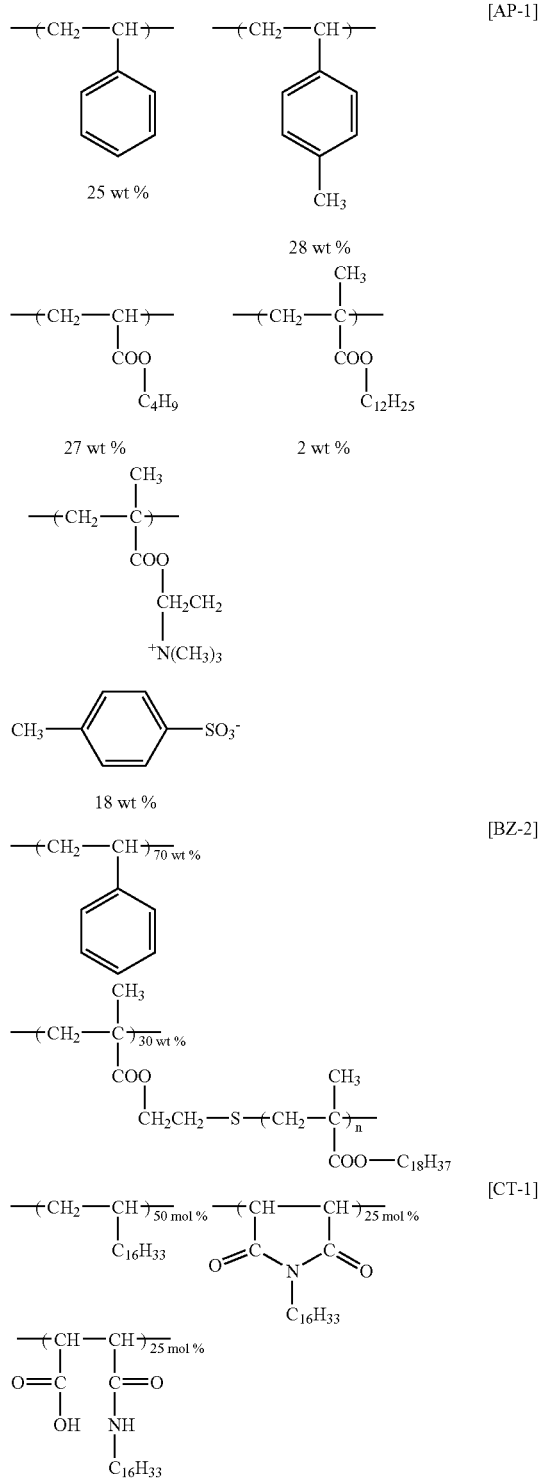

Example 1

An image mask having a 2% to 95% (120 lines/inch, screen) tonal range was formed on Photosensitive resin 1 by an electrostatic ink-jet printer using the above-mentioned carbon black-containing oil-based ink.

The masked flexographic printing starting plate thus obtained was removed from the ink-jet device, subjected to back flash exposure for 14 seconds using a Cyrel 3040 light source, and then subjected to surface exposure through the radiation-opaque patterned mask in a vacuum of 50 mmHg for 9 minutes.

The exposed masked flexographic printing starting plate was developed in a Cyrel Rotary processing machine using a 3:1 (volume/volume) mixture of perclene and butanol for 6 minutes. After ablation of the mask, unexposed areas of the photosensitive resin were removed, and a relief-shaped printing plate was formed. The printing plate was dried in an oven at 60° C. for 1 hour, and then subjected to simultaneous post exposure and finishing in a Cyrel photofinishing unit to give a flexographic printing plate.

Printing was carried out in a Mark Andy 830 press system using this printing plate and a Film III Dense Black EC 8630 ink (manufactured by Environmental Ink and Coating) after diluting it so as to have a viscosity of 27 seconds when measured using a #2 Zahn cup. A good printed image was obtained.

The reproducibility of the image was evaluated.

Example 2

The procedure of Example 1 was repeated except that Photosensitive resin 2 was used instead of Photosensitive resin 1.

Example 3

An image mask having a 2% to 95% (120 lines/inch, screen) tonal range was formed on Photosensitive resin 3 by an electrostatic ink-jet printer.

The masked flexographic printing starting plate thus obtained was removed from the ink-jet device, subjected to back flash exposure for 14 seconds using a Cyrel 3040 light source, and then subjected to surface exposure through the radiation-opaque patterned mask without vacuum for 9 minutes.

The exposed masked flexographic printing starting plate was developed in a Cyrel Rotary processing machine using tap water for 10 minutes. After ablation of the mask, unexposed areas of the photosensitive resin layer were removed, and a relief-shaped printing plate was formed. The printing plate was dried in an oven at 60° C. for 15 minutes, and then subjected to simultaneous post exposure and finishing in a Cyrel photofinishing unit to give a flexographic printing plate.

Printing was carried out by a flexographic printer using the printing plate thus obtained, and the reproducibility of the image was evaluated.

Example 4

The procedure of Example 3 was repeated except that Photosensitive resin 4 was used instead of Photosensitive resin 3.

Example 5

The procedure of Example 3 was repeated except that Photosensitive resin 5 was used instead of Photosensitive resin 3.

Example 6

The procedure of Example 1 was repeated except that Photosensitive resin 6 was used instead of Photosensitive resin 1.

Comparative Example 1

A flexographic printing plate was obtained by placing a litho film having a 2% to 95% (120 lines/inch, screen) tonal range on a type 67HLS Cyrel (™) flexographic plate manufactured by du Pont as the photosensitive resin layer, and carrying out overall exposure and development in the same manner as in Example 1.

Comparative Example 2

A flexographic printing plate was obtained by using a FAST Cyrel (™) flexographic plate manufactured by du Pont as the photosensitive resin layer, ablating the mask layer by means of an 830 nm infrared laser so as to give an image mask having a 2% to 95% (120 lines/inch, screen) tonal range, and carrying out overall exposure and development in the same manner as in Example 1.

Printing was carried out by a flexographic printer using the printing plates thus obtained, and the reproducibility of the image was evaluated.

With regard to running costs, the cost of plate materials, the cost of electricity, the cost of disposal of waste such as a liquid developer, etc. when 1,000 plates were made were calculated, and evaluated as a relative cost.

The results of evaluating the printing performance of the flexographic printing plates obtained in Examples 1 to 6 and Comparative Examples 1 and 2 are summarized in Table 1.

Evaluation was carried out as follows.

Image Quality
A: 2% to 95% gradation was reproduced as in the mask.
B: 3% to 95% gradation was reproduced.
C: 4% to 95% gradation was reproduced (poor reproducibility).

Running Cost
A: Cheaper than a conventional flexographic plate system (due to reduction in the cost of steps associated with a litho film)
C: Higher than the cost of a conventional flexographic plate system

TABLE 1

| | Photosensitive layer | Liquid developer | Image quality | Running cost |
|---|---|---|---|---|
| Example 1 | Photosensitive resin 1 | Hydrocarbon | A | A |
| Example 2 | Photosensitive resin 2 | Hydrocarbon | A | A |
| Example 3 | photosensitive resin 3 | Aqueous | A | A |
| Example 4 | Photosensitive resin 4 | Aqueous | A | A |
| Example 5 | Photosensitive resin 5 | Aqueous | A | A |
| Example 6 | Photosensitive resin 6 | Hydrocarbon | B | A |
| Comparative Example 1 | Conventional flexographic plate | Hydrocarbon | C | C |
| Comparative Example 2 | Flexographic CTP | Hydrocarbon | A | C |

From the results above, it can be seen that the plate-making process for a flexographic printing plate of the present invention is a novel process that can change a conventional flexographic plate into flexographic CTP, and is a system that can achieve both high image quality and low running costs, which contribute to advantages to the user.

Example 7

Preparation of Ink Composition 10 g of a carbon black pigment shown in Table 2 and 20 g of a coating agent [AP-1] were placed in a PBV-0.1 desk-top kneader manufactured by Irie Shokai K.K., and mixed by heating at a heater temperature of 100° C. for 2 hours. 30 g of the mixture thus obtained was roughly ground in a Trio blender manufactured by Trioscience K.K., and further finely ground in a Model SK-M10 sample mill manufactured by Kyoritsu Riko K.K. 30 g of the finely ground substance thus obtained was predispersed together with 7.5 g of a dispersant [BZ-2], 75 g of ISOPAR G, and glass beads having a diameter of about 3.0 mm in a paint shaker manufactured by Toyo Seiki Co., Ltd. After removing the glass beads, dispersion (particle formation) was carried out together with zirconia ceramic beads having a diameter of about 6.0 mm in a Type KDL Dynomill manufactured by Shinmaru Enterprise K.K. at a rotational speed of 2,000 rpm while maintaining the internal temperature at 25° C. for 5 hours, and subsequently at 45° C. for 8 hours. The zirconia ceramic beads were removed from the dispersion thus obtained, and 316 g of ISOPAR G and 0.6 g of a charge adjusting agent [CT-1] were added to give an ink composition. The physical properties of the ink composition were as follows.

The electrical conductivity of the ink composition at 20° C. was measured using an LCR meter (AG4311 manufactured by Ando Electric Co., Ltd.) and electrodes for a liquid (Model LP-05 manufactured by Kawaguchi Electric Works Co., Ltd.) at an applied voltage of 5 V and a frequency of 1 kHz, and it was found to be 100 nS/m.

The ink composition was subjected to centrifugal separation using a small scale high speed cooled centrifuge (SRX-201 manufactured by Tomy Seiko Co., Ltd.) at a rotational speed of 14,500 rpm and a temperature of 20° C. for 30 minutes, thus making the charged particles settle out. The electrical conductivity of the supernatant liquid was measured, and it was found to be 30 nS/m. The electrical conductivity of the charged particles was 70 nS/m, which was 70% of the electrical conductivity of the ink composition. Furthermore, the charge of the charged particles was positive.

The volume-average diameter of the charged particles was measured using a CAPA-700 manufactured by Horiba Ltd. at a rotational speed of 5,000 rpm, and it was found to be 2.0 μm. The number-average diameter was 0.15 μm.

The viscosity of the ink composition at 20° C. was measured by a Model E viscometer manufactured by Tokyo Keiki K.K., and it was found to be 1.5 mPa·s. The surface tension of the ink composition at 20° C. was measured using a FACE automatic surface tension meter manufactured by Kyowa Kaimen Kagku K.K., and it was found to be 25 mN/m.

The structural formulae of the coating agent [AP-1], the dispersant [BZ-2], and the charge adjusting agent [CT-1] used in the formation of the ink composition are shown above.

The procedure of Example 1 was repeated except that inks employing various types of carbon black as a pigment were used and image masks were formed by double printing the oil-based ink, and the mask image formation performance was evaluated.

By double printing the oil-based ink, masks having a sufficiently high optical density were obtained.

The results are summarized in Table 2.

and the relationships between the surface resistivity of the photosensitive resin layer and the charge stability, the charge uniformity, and the printing performance were evaluated.

TABLE 2

| Type | Pigment particle size (nm) | PVC blackness | Resistance | Spreading | Head electrode deposit | Mask formation |
|---|---|---|---|---|---|---|
| #3030B (Mitsubishi Chemical Corp.) | 55 | — | Low resistance ($1 \times 10^{-3}$ Ω·cm or less) | None | Cleaning required after 100 hours of printing | 1.5 |
| #3040B (Mitsubishi Chemical Corp.) | 50 | — | | | | 1.6 |
| #3050B (Mitsubishi Chemical Corp.) | 50 | — | | | | 1.4 |
| MA-8 (Mitsubishi Chemical Corp.) | 24 | 20 | High resistance ($1 \times 10^{-2}$ Ω·cm) | | Cleaning required after 300 hours of printing | 1.5 |
| MA-100 (Mitsubishi Chemical Corp.) | 22 | 10 | | | | 1.6 |
| #25 (Mitsubishi Chemical Corp.) | 47 | 4 | | | | 1.7 |
| #5 (Mitsubishi Chemical Corp.) | 76 | 1 | | | | 1.3 |
| MA-100R (Mitsubishi Chemical Corp.) | 24 | 10 | | | | 1.5 |
| MA-200RB (Mitsubishi Chemical Corp.) | 30 | 2 | | | | 1.6 |
| Sample A (Mitsubishi Chemical Corp.) | 40 to 50 | — | High resistance ($1 \times 10^{2}$ Ω·cm) | | Cleaning not required even after 400 hours of printing | 2.0 |
| Sample B (Mitsubishi Chemical Corp.) | 40 to 50 | — | | | | 2.2 |

In the table, the mask formation is evaluated by the image density after printing once. The image density is preferably at least 2.0, more preferably at least 3.0, and particularly preferably at least 4.0.

From the results above, it can be seen that use of carbon black having a high resistance of $1 \times 10^2$ Ω·cm enables a particularly good mask image density to be obtained. Furthermore, even after 400 hours of printing it was unnecessary to clean the head electrode.

Example 8

Resin 1

When preparing Photosensitive resin layer 1, betaine (structural formula shown below) was added as an antistatic agent at 5 wt % of the total amount of the composition of the photosensitive resin layer.

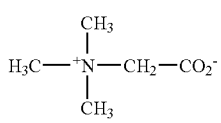

Resin 2

When preparing Photosensitive resin layer 1, betaine was added as an antistatic agent at 2 wt % of the total amount of the composition of the photosensitive resin layer.

Resin 3

Photosensitive resin layer 1 was used as it was.

The procedure of Example 1 was repeated except that Resins 1 to 3 were used as the photosensitive resin layers, Evaluation was carried out as follows.

Charge Stability

B: surface potential of the flexographic printing plate after being allowed to stand for 1 minute after charging/surface potential of the flexographic printing plate immediately after charging×100 (%) was 90% or more but less than 95%.

A: surface potential of the flexographic printing plate after being allowed to stand for 1 minute after charging/surface potential of the flexographic printing plate immediately after charging×100 (%) was 95% or more.

Charge Uniformity

A: the surface potential variation over the entire surface of the flexographic printing plate was 10% or less.

C: the surface potential variation over the entire surface of the flexographic printing plate exceeded 10%

Printing Performance

Good: when examined visually at a distance of 30 cm, no unevenness was observed.

The results are summarized in Table 3.

TABLE 3

| | Surface resistivity (Ω/□) | Charge stability | Charge uniformity | Printing performance |
|---|---|---|---|---|
| Resin 1 | $2 \times 10^{10}$ | B | A | Good |
| Resin 2 | $8 \times 10^{12}$ | A | A | Good |
| Resin 3 | $10^{13}$ or more | A | A | Good |

From the results above, it can be seen that when the surface resistivity of the photosensitive resin layer is $2\times10^{10}$ $\Omega/\square$ or more, good charge stability, charge uniformity, and printing performance can be obtained.

What is claimed is:

1. A process for making a flexographic printing plate, the process comprising:
    a step of forming an image mask on a flexographic printing starting plate by discharging an oil-based ink by an electrostatic ink-jet method, the flexographic printing starting plate having a support and a photosensitive resin layer provided thereon; wherein the oil-based ink discharged is overprinted a plurality of times; wherein the oil-based ink comprises a coloring agent that absorbs or reflects light to which it is exposed; and wherein the oil-based ink is a dispersion in which charged particles of a dye or a pigment are dispersed in an insulative organic solvent,
    a step of subjecting the photosensitive resin layer to overall exposure via the image mask, wherein the photosensitive resin layer used has a surface resistivity of $1\times10^{10}$ $\Omega/\square$ or more; and
    a step of developing the photosensitive resin layer thus exposed.

2. The plate-making process according to claim 1, wherein the pigment is a high resistivity carbon black.

3. The plate-making process according to claim 1, wherein the insulative organic solvent is selected from the group consisting of straight-chain or branched aliphatic hydrocarbons, alicyclic hydrocarbons, aromatic hydrocarbons, and halogen-substituted derivatives of these hydrocarbons.

4. The plate-making process according to claim 1, wherein the oil-based ink has a viscosity of 0.5 to 5 mPa·sec.

5. The plate-making process according to claim 1, wherein the process further comprises a back flash exposure step.

6. The plate-making process according to claim 1, wherein the process further comprises a post exposure step subsequent to the development step.

7. The plate-making process according to claim 1, wherein the support is a polyester.

8. The plate-making process according to claim 1, wherein the photosensitive resin layer comprises a microgel binder.

9. A process for making a flexographic printing plate according to claim 1, wherein the charged particles are particles of a pigment.

10. A process for making a flexographic printing plate according to claim 9, wherein a charge control agent is used to charge the particles of the pigment.

11. A process for making a flexographic printing plate according to claim 10, wherein the amount of charge is in the range of 5 to 200 µC/g.

* * * * *